(12) United States Patent
Hori et al.

(10) Patent No.: US 7,133,218 B2
(45) Date of Patent: Nov. 7, 2006

(54) OPTICAL SYSTEM

(75) Inventors: Takanobu Hori, Hyogo (JP); Isao Tokomoto, Hyogo (JP); Hiroshi Kajiyama, Ibaraki (JP); Akira Kato, Ibaraki (JP); Kenichi Onisawa, Ibaraki (JP); Makoto Abe, Ibaraki (JP); Shoichi Hirota, Ibaraki (JP); Tatsuya Sugita, Ibaraki (JP); Masaya Adachi, Ibaraki (JP); Katsumi Kondo, Ibaraki (JP)

(73) Assignees: Shinmaywa Industries, Ltd., Hyogo (JP); Hitachi, Ltd., Tokyo (JP)

( * ) Notice: Subject to any disclaimer, the term of this patent is extended or adjusted under 35 U.S.C. 154(b) by 259 days.

(21) Appl. No.: 10/251,168

(22) Filed: Sep. 20, 2002

(65) Prior Publication Data

US 2003/0058547 A1    Mar. 27, 2003

(30) Foreign Application Priority Data

Sep. 20, 2001 (JP) .............................. 2001-287114
Mar. 29, 2002 (JP) .............................. 2002-094173
Aug. 30, 2002 (JP) .............................. 2002-252257

(51) Int. Cl.
*G02B 9/00* (2006.01)

(52) U.S. Cl. .................... 359/738; 359/227; 359/228

(58) Field of Classification Search ................ 359/227, 359/228, 634, 738, 296
See application file for complete search history.

(56) References Cited

U.S. PATENT DOCUMENTS

| | | | |
|---|---|---|---|
| 5,552,083 A * | 9/1996 | Watanabe et al. | 516/31 |
| 5,891,565 A * | 4/1999 | Watanabe et al. | 428/328 |
| 6,020,945 A * | 2/2000 | Sawai et al. | 349/119 |
| 6,210,858 B1 | 4/2001 | Yasuda et al. | |
| 6,364,946 B1 * | 4/2002 | Staeblein et al. | 117/81 |
| 6,512,512 B1 * | 1/2003 | Blanchard | 345/173 |
| 6,611,299 B1 * | 8/2003 | Fujii et al. | 349/12 |
| 6,669,536 B1 * | 12/2003 | Sabia | 451/41 |

FOREIGN PATENT DOCUMENTS

| | | | |
|---|---|---|---|
| EP | 0 402 473 | | 12/1990 |
| JP | 02026824 A | * | 1/1990 |
| JP | 02256001 A | * | 10/1990 |
| JP | 6115023 | | 4/1994 |
| JP | 07-188912 | | 7/1995 |
| JP | 08-048935 | | 2/1996 |
| JP | 09-243802 | | 9/1997 |
| JP | 10-090532 | | 4/1998 |
| JP | 11-181327 | | 7/1999 |

(Continued)

OTHER PUBLICATIONS

"Ultrafine particle applied technology" First Edition published on Sho. 61, Oct. 30, 1986, Editor: (Corporation) Japanese powder industrial technology institution, Publishing office: Nikkan Kogyoshinbunsha; ISBN: 4526020877.

*Primary Examiner*—Timothy Thompson
(74) *Attorney, Agent, or Firm*—Marshall, Gerstein & Borun LLP

(57) ABSTRACT

Disclosed is an optical system that has superior optical characteristic and wear resistance and can be formed at low temperatures. An optical system 101 for adjusting visible light transmittance to have a desired value comprises fluoride 103, and at least part of the optical system has a crystal grain diameter of 3 nm to 10 nm. The fluoride 103 has a specific surface area of 1 $m^2/g$ to 5 $m^2/g$.

37 Claims, 20 Drawing Sheets

| | CRYSTAL GRAIN DIAMETER(nm) |
|---|---|
| FILM DEPOSITED AT 300°C | 12~20 |
| NO HEATING OF SUBSTRATE | CRYSTAL GRAIN DIAMETER IS NOT DEFINED |
| APPLY POSITIVE BIAS | 3~10 |

| | FOREIGN PATENT DOCUMENTS | | | WO | WO 98/45734 | 10/1998 |
|----|----|----|----|----|----|----|
| JP | 2001215476 A | * | 8/2001 | | | |
| KR | 2001-0006048 | | 1/2001 | * cited by examiner | | |

| | CRYSTAL GRAIN DIAMETER (nm) |
|---|---|
| FILM DEPOSITED AT 300°C | 12~20 |
| NO HEATING OF SUBSTRATE | CRYSTAL GRAIN DIAMETER IS NOT DEFINED |
| APPLY POSITIVE BIAS | 3~10 |

Fig. 8

OPTICAL SYSTEM

BACKGROUND OF THE INVENTION

1. Field of the Invention

The present invention relates to an optical system including fluoride.

2. Description of the Related Art

Optical systems such as optical lenses, displays, or optical waveguides include antireflection coatings for lessening a loss of light amount or the like due to reflection. Magnesium fluoride ($MgF_2$) has been widely used as an antireflection material of a low refractive index. This is because i) $MgF_2$ produces a high antireflection effect because of its low refractive index (1.38), ii) $MgF_2$ can be easily formed into a film by vacuum evaporation, and iii) $MgF_2$ has sufficient durability when formed on a surface of a substrate heated to about 300° C.

However, when the substrate is made of plastic or is provided with an electric circuit such as a semiconductor, it is impossible to heat the substrate to 300° C. or higher. Therefore, it is impossible to manufacture an optical system configured such that a magnesium fluoride film is formed on the substrate having such a low heat resistance. While Japanese Laid-Open Patent Application Publication No. HEI. 09-243802 discloses a method of depositing magnesium fluoride at low temperatures using special sputtering, a specific characteristic of the magnesium fluoride film is not clearly described there.

Japanese Laid-Open Patent Application Publication No. Hei. 10-90532 discloses an optical waveguide comprising a substrate having a low refractive index and provided with grooves on a main surface thereof, transparent resin having a high refractive index and filled in the grooves, and resin having a low refractive index and covering the main surface, and a manufacturing method thereof. In this optical waveguide, the substrate is made of PMMA (polymethylmethatcrylate) having a relatively high refractive index (1.49). Because a material having a refractive index higher than that of the PMMA substrate needs to be selected as the transparent resin to be filled in the grooves, and transparent resin that reacts with the substrate cannot be used, available transparent resin is limited.

A problem associated with a touch panel is that, in a device including an electronic display such as a liquid crystal display or a touch panel provided on the electronic display, ambient light from outside incident on a display surface of the device is reflected under bright environment, so that image contrast is reduced, and ambient environment is mirrored in the display surface, thereby resulting in degraded visibility. Under the circumstance, for the purpose of improving image contrast and visibility, an attempt has been made to prevent occurrence of surface reflection on the surface of the liquid crystal display or the surface of the touch panel provided on the surface of the liquid crystal display. As a method of preventing the surface reflection, there are two known methods in which, i) on a surface of a transparent film constituting a polarizer of the liquid crystal display, or on a transparent substrate on a surface side of the touch panel, a film having a refractive index lower than that of the transparent film or the transparent substrate is formed to have thickness equal to ¼ of a visible wavelength, for reducing reflection by interference effect, and ii) two or more types of layers having different refractive indices are formed for reducing the reflection in a wider wavelength range.

As method of forming the antireflection coating on the surface of the polarizer or the surface of the touch panel, there are methods in which i) fluoride such as magnesium fluoride is deposited to form the antireflection coating by vacuum evaporation or sputtering, and ii) a solution obtained by dissolving resin such as polymer containing fluorine with a low refractive index is coated and dried to form the antireflection coating (see Japanese Laid-Open Patent Application Publication No. Hei. 6-115023).

However, in the method of depositing fluoride to form the antireflection coating, a high temperature of 300° C. or higher is required to form the magnesium fluoride film that has high transmittance and high wear resistance, and hence, this method cannot be applied to the polarizer or the touch panel with low heat-resistance temperature. Besides, since the magnesium fluoride film deposited by vacuum evaporation, sputtering, or the like is generally polycrystalline having a column-shaped structure, it is porous as having a specific surface area which is greater than 10 $m^2$/g. Therefore, the film has a drawback of high water absorbing ability. Specifically, since the amount of water absorbed in the magnesium fluoride film varies with variation in ambient temperature and humidity (moisture content), the refractive index of the film is shifted depending on environmental conditions. Further, it is necessary to deposit the film allowing for the environmental conditions and variation in the refractive index. Meanwhile, there is a method in which titanium oxide ($TiO_2$) and silicon oxide ($SiO_2$) which can be formed into films at low temperatures are alternately disposed, but in this method, five or more layers are required for achieving low reflectance in a wide wavelength range, which leads to reduced productivity.

The method of coating and drying the solution to form the antireflection coating is capable of forming the antireflection coating of large area with increased productivity, but the polymer containing fluorine has generally low hardness and low wear resistance. Accordingly, there has been proposed a method of applying a multifunctional polymeric monomer containing fluorine and then polymerizing and curing the monomer by electron beam irradiation (see Japanese Laid-Open Patent Application Publication No. Hei. 8-48935). This method offers a film comprised of a polymer containing fluorine that has hardness and improved wear resistance, but might damage the substrate or the like, for example, color the substrate, by the electron beam irradiation.

SUMMARY OF THE INVENTION

The present invention is directed to solving the aforementioned problems, and an object of the present invention is to provide an optical system that has superior optical characteristic and wear resistance and can be formed at low temperatures.

Another object of the present invention is to provide an optical waveguide that is easy to manufacture and has freedom in selecting a substrate material and a filling material.

Another object of the present invention is to provide a touch panel that has superior optical characteristic and wear resistance and does not damage a substrate.

Another object of the present invention is to provide an optical system which has a small amount of absorbed water, is hardly affected by change in environmental conditions such as temperature and humidity, and has stable optical characteristics.

To solve the above-mentioned problems, there is provided an optical system of the present invention comprising fluoride, at least part of the optical system having a crystal grain diameter of 3 nm to 10 nm. Thereby, since fluoride that has superior optical characteristics and wear resistance can be formed at low temperatures, an optical system that has superior optical characteristics and wear resistance can be constructed even when using a substrate that has low heat resistance.

The fluoride may be magnesium fluoride. Since a refractive index of magnesium fluoride is 1.38, a control range of transmittance of the optical system can be extended.

The fluoride may be formed on a silica substrate. Since this structure realizes an optical system in which fluoride is formed on the silica substrate at low temperatures, energy consumption in production is suppressed and productivity is improved.

The fluoride may be formed on a resin substrate. By thus forming the fluoride film on the resin substrate, the optical system such as the antireflection coating can be formed. Consequently, the optical system can be constructed on a variable substrate such as a sheet display.

The optical system may be a dielectric multilayered film reflector. By forming the dielectric multilayered film structure containing the fluoride, it is possible to construct the optical system that is adapted to control transmittance and reflectance of light to have desired values.

The optical system may be an optical waveguide. Thereby, it is possible to construct a buried optical waveguide that is easy to manufacture and has freedom in selecting the substrate material and the filling material.

The optical system may be an antireflection coating.

The optical system may be a polarizer used in a display.

The optical system may be a touch panel used in the display. Thereby, it is possible to construct a touch panel that has superior optical characteristic and wear resistance and hardly damages the substrate in manufacture.

The touch panel may be comprised of a polarizer having a magnesium fluoride film and a ¼ wavelength plate.

The optical system of the present invention is manufactured at a temperature ranging from normal temperature to 100° C. and is at least partially comprised of fluoride. Thereby, since the fluoride that has superior optical characteristic and wear resistance is formed at low temperatures, the optical system that has superior optical characteristic and wear resistance can be constructed even when using the substrate that has low heat resistance.

The optical system of the present invention includes a magnesium fluoride film formed on the substrate by a process of placing a substrate on a film deposition side of a bias supply electrode disposed in a vacuum chamber; a process of evaporating magnesium fluoride; a process of supplying a radio frequency voltage to the bias supply electrode used as one electrode to generate plasma in the vacuum chamber; and a process of applying to the bias supply electrode a bias voltage that varies in the form of a wave as having a negative mean value and a positive maximum value and has a frequency between 100 kHz and 2.45 GHz. Thereby, the application of the positive-pulse bias voltage allows dissociation of fluoride to be suppressed and the fluoride film with superior optical characteristic and wear resistance to be formed at low temperatures. Consequently, the optical system that has superior optical characteristic and wear resistance can be constructed even when using the substrate that has low heat resistance.

The optical system of the present invention comprises fluoride, at least part of the optical system having a specific surface area of 1 $m^2/g$ to 5 $m^2/g$. The amount of water absorbed in the film is nearly proportional to a physical specific surface area of the film in such a way that the amount of absorbed water decreases as the specific surface area decreases. Since the optical system configured as described above has the fluoride having the relatively small specific surface area of 1 $m^2/g$ to 5 $m^2/g$, it satisfactorily suppresses absorption of water, is hardly affected by environmental conditions, and has satisfactory optical characteristic with less variation in refractive index.

In the optical system of the present invention, the part of the optical system may be a surface layer portion. In other words, at least the surface layer portion may be comprised of fluoride having a specific surface area of 1 $m^2/g$ to 5 $m^2/g$. In the optical system, the surface layer portion tends to absorb water. Since in the optical system so configured, the surface layer portion that tends to absorb water is comprised of fluoride having the relatively small surface area, the optical system is hardly affected by the environment conditions such as temperature and humidity and has satisfactory optical characteristic with less variation in refractive index.

In the optical system of the present invention, the fluoride may be magnesium fluoride. Since the magnesium fluoride has a relatively low refractive index, the optical system configured as described above is expected to be promising as the optical system that requires a low refractive index.

The optical system of the present invention may be an antireflection coating. The optical system so configured can realize a satisfactory antireflection coating which is hardly affected by the environmental conditions and has less variation in refractive index.

The above and further objects and features of the invention will more fully be apparent from the following detailed description with accompanying drawings.

BRIEF DESCRIPTION OF THE DRAWINGS

FIG. 8 is a table showing a crystal grain diameter of the magnesium fluoride thin film;

DETAILED DESCRIPTION OF THE PREFERRED EMBODIMENTS

Now, preferred embodiments of the present invention will be described with reference to the accompanying drawings.

Embodiment 1

Figure 1:
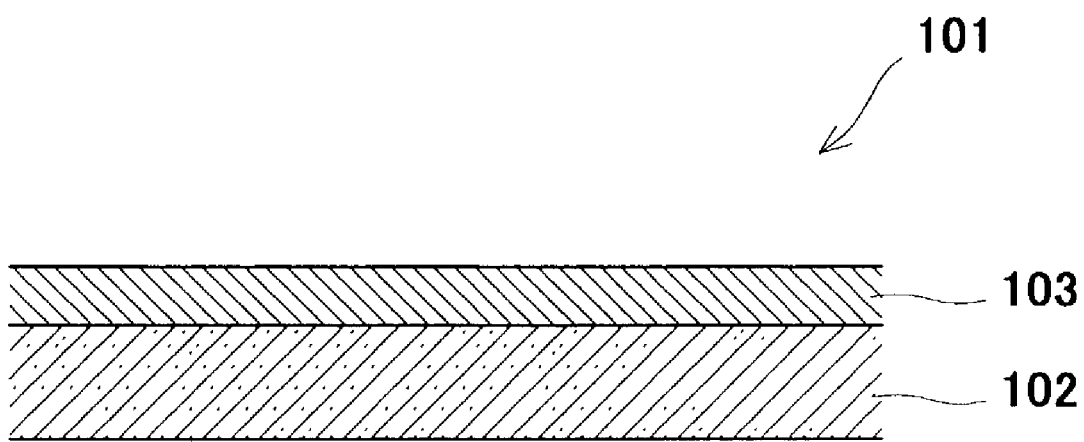
FIG. 1 is a cross-sectional view showing a configuration of an optical system according to a first embodiment of the present invention.

FIG. 1 is a cross-sectional view showing a structure of an optical system according to a first embodiment of the present invention. As shown in FIG. 1, an optical system 101 of this embodiment is structured such that a film 103 comprised of fluoride (hereinafter referred to as "a fluoride film") is formed on a substrate 102. The substrate 102 is made of a material such as glass, quarts ($SiO_2$), resin or the like. In the optical system 101, transmittance of visible light varies according to film thickness of the fluoride film 103. Therefore, by setting the film thickness of the fluoride film 103 according to required transmittance of visible light, the optical system 101 having desired visible light transmittance can be created.

One feature of this embodiment is that the fluoride film 103 has a crystal grain diameter of 3 nm to 10 nm. This means that the fluoride film 103 is formed at a temperature ranging from normal temperature to about 100° C. (hereinafter also referred to as "low temperature"). The fluoride film 103 has certain durability as mentioned later. Although it was conventionally impossible to obtain the fluoride film formed at such a low temperature and having certain durability, tremendous research efforts of the inventors has made it possible to obtain the fluoride film 103 by using a special ion plating system mentioned below. Since the fluoride film 103 can be formed at a low temperature, various types of optical systems having the fluoride film can be formed for substrates with low heat resistance, including a thermoplastic resin substrate, a substrate having a semiconductor circuit, etc., in addition to a heat-resistant substrate such as a glass substrate. Magnesium fluoride ($MgF_2$) is preferably used as the fluoride, because of its low refractive index (1.38), high antireflection effect, and sufficient durability when formed into the film under proper conditions.

Figure 2A:
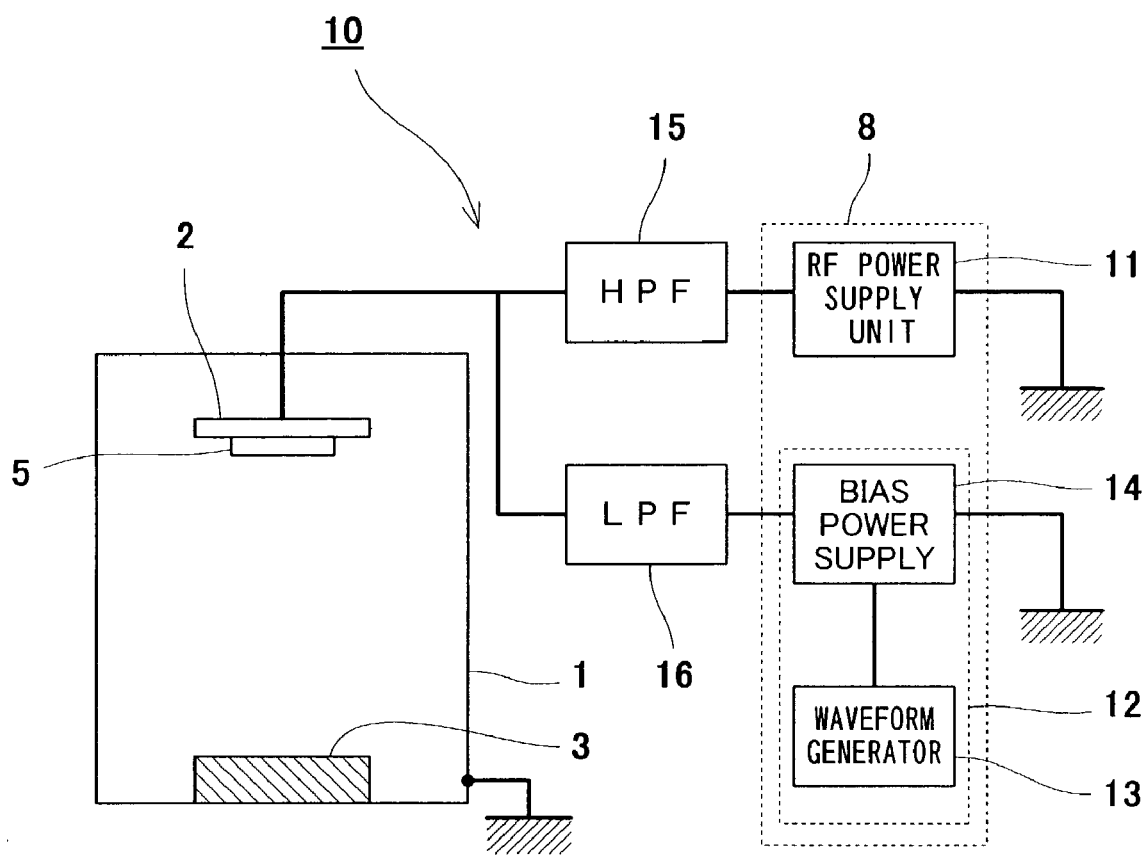
FIG. 2A is a schematic view showing a configuration of a film deposition system capable of manufacturing the optical system in FIG. 1.

Subsequently, an example of a suitable manufacturing system of the optical system 101 of this embodiment will be explained. FIG. 2A is a schematic view showing a configuration of a film deposition system 10 capable of manufacturing the optical system 101. The film deposition system 10 is constituted to deposit the film based on ion plating as a method of depositing the film.

The film deposition system 10 comprises a vacuum chamber 1 and a power supply unit 8. The power supply unit 8 comprises a radio frequency power supply unit 11 and a bias power supply unit 12.

In an upper portion inside the vacuum chamber 1, a substrate holder 2 is placed for holding a substrate 5 from its back-surface side that is opposite to its front surface on which a film is to be deposited. The substrate holder 2 in FIG. 2A is made of an electrically conductive material to enable a power to be supplied to the inside of the vacuum chamber 1. The substrate holder 2 constitutes an electrode for enabling both a bias power and a radio frequency (RF) power to be supplied inside of the vacuum chamber 1 as mentioned later.

The substrate 2 is rotatably driven by a motor (not shown). By rotating the substrate holder 2, the film can be deposited while rotating the substrate 5.

In a lower portion inside the vacuum chamber 1, an evaporation source 3 is provided for holding a film material made of fluoride and evaporating the material in a space inside the chamber 1. The film deposition system 10 is further provided with an evacuation means such as a vacuum pump and a gas supply means, which are not shown, for evacuating the chamber 1 to have a desired vacuum atmosphere. That is, the vacuum chamber 1 can be freely adjusted to have a desired vacuum atmosphere meeting deposition conditions.

The vacuum chamber 1 is made of a conductive material and its chamber wall is electrically grounded.

The RF power supply unit 11 has output terminals. One of the output terminals is connected to the substrate holder 2 through a high pass filter 15 and the other output terminal is electrically grounded. RF power output from the RF power supply unit 11 is applied to the substrate holder 2. As a result, inside the vacuum chamber 1, plasma is generated, and the film material evaporated from the evaporation source 3 is ionized (excited).

The high pass filter 15 is provided between the RF power supply unit 11 and the substrate holder 2, for passing a power output from the RF power supply unit 11 therethrough toward the substrate holder 2, and preventing a power output from the bias power supply unit 14 from being input to the RF power supply unit 11.

As for specific power value and frequency of the power output from the RF power supply unit 11, a desired value and frequency are selected according to kind of the film material or film deposition conditions.

A matching box (not shown) is provided between the RF power supply unit 11 and the high pass filter 15. The matching box is constituted by a well-known matching circuit comprising a capacitor, coil, etc. The adjustment of the matching circuit enables matching between impedance on the side of the RF power supply unit 11 and impedance on the side of the vacuum chamber 1.

The bias power supply unit 12 comprises a waveform generator 13 and a bias power supply 14. The waveform generator 13 is adapted to generate a waveform of a bias voltage to be output from the bias power supply unit 12 and input the waveform to the bias power supply 14. The waveform generator 13 is capable of generating a direct current (DC) component steadily having a constant value, an alternating current (AC) component of each frequency, and various types of waveforms such as square waves or triangle waves as basic waveforms. The waveform generator 13 is also capable of composing a plurality of basic waveforms into another basic waveform. The bias power supply 14 serves to amplify the basic waveform generated by the waveform generator 13 into a bias voltage having a predetermined value.

The bias power supply 14 has output terminals. One of the output terminals is connected to the substrate holder 2 through a low pass filter 16 and the other output terminal is electrically grounded. The bias voltage output from the bias power supply 14 is applied to the substrate holder 2.

The low pass filter 16 is provided between the bias power supply 14 and the substrate holder 2, for passing a power output from the bias power supply 14 therethrough toward the substrate holder 2 and preventing a power output from the RF power supply unit 11 from being input to the bias power supply unit 12.

Figure 2B:
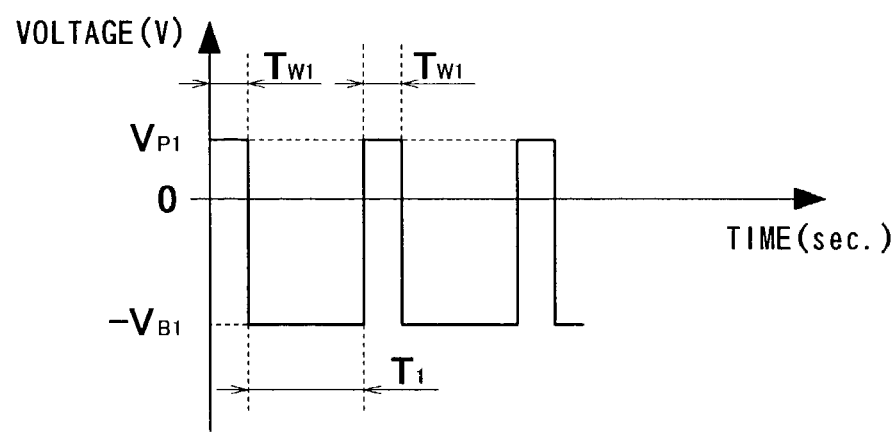
FIG. 2B is a graph showing a waveform of a bias voltage output from a bias power supply unit in the film deposition system in FIG. 2A.

Subsequently, the bias voltage output from the bias power supply unit 12 will be explained. FIG. 2B shows an example of the waveform of the bias voltage. In FIG. 2B, a lateral axis represents time (sec) and a longitudinal axis represents a voltage value (V).

As shown in FIG. 2B, the bias voltage periodically varies between a positive value and a negative value. More specifically, the bias voltage is composed of a positive bias having a constant positive value ($V_{p1}$) for a duration ($T_{w1}$) in a period ($T_{w1}+T_1$) and a negative bias having a constant negative value ($-V_{B1}$) for the remaining duration ($T_1$), thus forming a square pulse wave.

By using the film deposition system 10 described above, the film is deposited as described below. The evaporation source 3 is filled with a film material made of fluoride and the substrate 5 is set on the substrate holder 2. In setting the substrate 5 on the substrate holder 2, the surface of the substrate 5 on which the film is to be deposited is opposed to the evaporation source 3.

Then, the power supply unit 8 is operated, thereby supplying a RF power to the inside of the chamber 1 through the substrate holder 2, and further applying a bias voltage to the substrate holder 2, while evaporating the fluoride from the evaporation source 3. As a result, plasma is generated in the vacuum chamber 1. The fluoride evaporated from the evaporation source 3 is ionized (excited) by the plasma, and ions of the fluoride are incorporated into and adheres to the substrate 5, thus depositing a fluoride film on the surface of the substrate 5.

In a process of depositing the film on the substrate 5 using the film deposition system 10, when a RF voltage is applied to the substrate holder 2 in the presence of the plasma in the chamber 1, a negative potential due to a so-called self-bias is generated in the vicinity of the surface of the substrate 5.

The negative potential due to the self-bias and the negative bias of the bias voltage make it possible to accelerate the movement of positively-charged fluoride ions toward the substrate 5. Thus, the negative bias of the bias voltage enables further acceleration of movement of the fluoride ions, and deposition of a denser film on the substrate 5.

In a film deposition process using the film deposition system 10, fluorine with weak chemical bond are easily dissociated from the ionized fluoride. However, since the bias voltage has a positive value for the duration $T_{w1}$, negatively-charged fluorine ions can be incorporated into the substrate 5. This prevents deficiency of fluorine in the film deposited on the substrate 5 and hence degraded function of the film which would occur due to deficiency of fluorine.

Here, the above-identified self-bias will be described in brief. The high pass filter 15 includes a blocking capacitor (not shown) connected in series with the RF power supply unit 11. The blocking capacitor has a capability of transmitting the RF component of current and blocking the DC component. When the RF power is supplied to the inside of the vacuum chamber 1, plasma is generated and charges flow from the plasma into the substrate holder 2 and are built up on the blocking capacitor. As a result, an offset voltage depending on a capacitance of the blocking capacitor and charge amount is generated at both ends of the blocking capacitor and is applied to the substrate holder 2. Comparing the electrons and the ions in the plasma, the electrons move toward the substrate faster than the ions. Therefore, the offset voltage has a negative constant value on the side of the substrate holder 2. The voltage so generated at the electrode (substrate holder 2) in contact with the plasma is called the self-bias.

Figure 3:
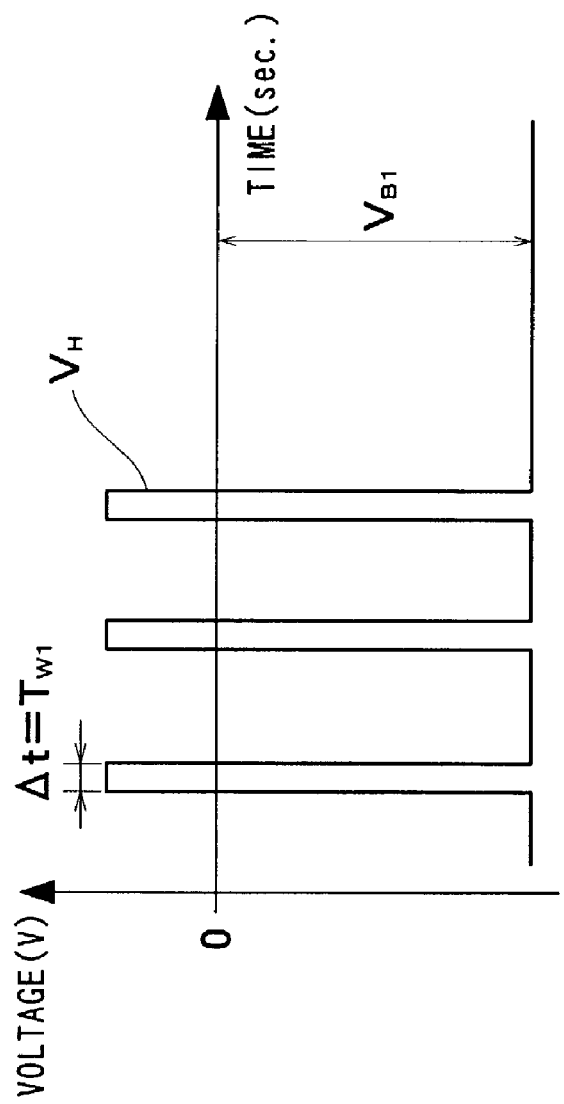
FIG. 3 is a graph showing potential of a substrate holder.

Subsequently, the relationship between the self-bias and the bias voltage output from the bias power supply unit 12 will be described. The blocking capacitor and the bias power supply unit 12 are connected in parallel with each other with respect to the substrate holder 2. In this case, one of the self-bias and the bias voltage by the bias power supply unit 12, which is superior, is predominantly applied to the substrate holder 2. In this embodiment, the superior one is the bias voltage by the bias power supply unit 12. The bias voltage is predominantly applied to the substrate holder 2. FIG. 3 is a graph showing potential of the substrate holder 2. As shown in FIG. 3, potential $V_H$ of the substrate holder 2 substantially conforms to the bias voltage (see FIG. 2B) by the bias power supply unit 12, and varies like the same.

Figure 4:
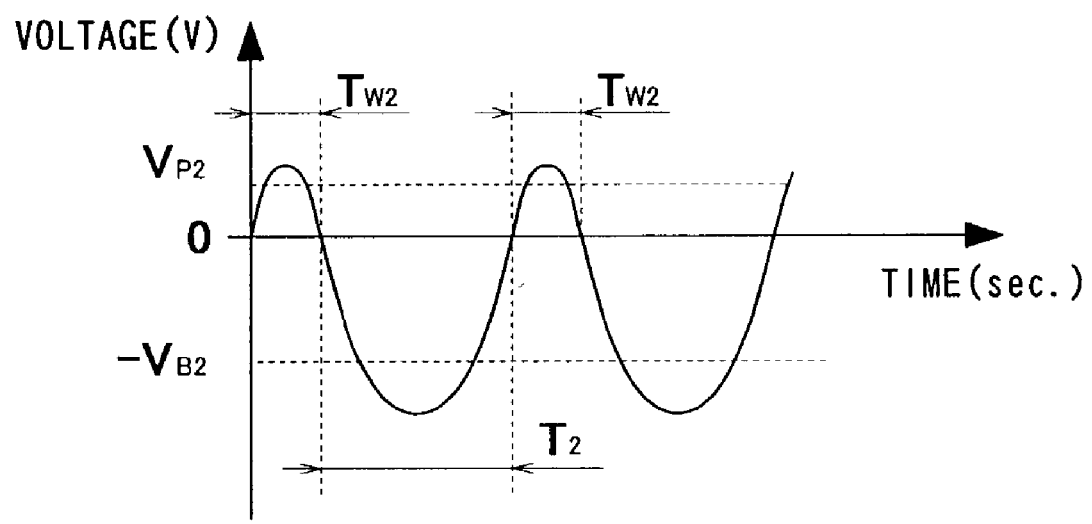
FIG. 4 is a graph showing another waveform of the bias voltage output from the bias power supply unit.

Subsequently, another example of the bias voltage will be described with reference to FIG. 4. FIG. 4 shows an example of another example of the bias voltage. The bias voltage in FIG. 4 entirely forms a smooth sine wave waveform, and periodically varies between a positive value and a negative value. More specifically, the bias voltage is composed of a positive bias having a positive value (actual value: $V_{p2}$) in the form of a sine wave for a duration $T_{w2}$ in a period ($T_{w2}+T_2$) and a negative bias having a negative value (actual value: $-V_{B2}$, $V_{B2}>V_{p2}$) for the remaining duration ($T_2$). The bias voltage in the waveform in FIG. 4 can be obtained by adding a DC voltage having a negative constant value to an AC voltage.

Figure 5:
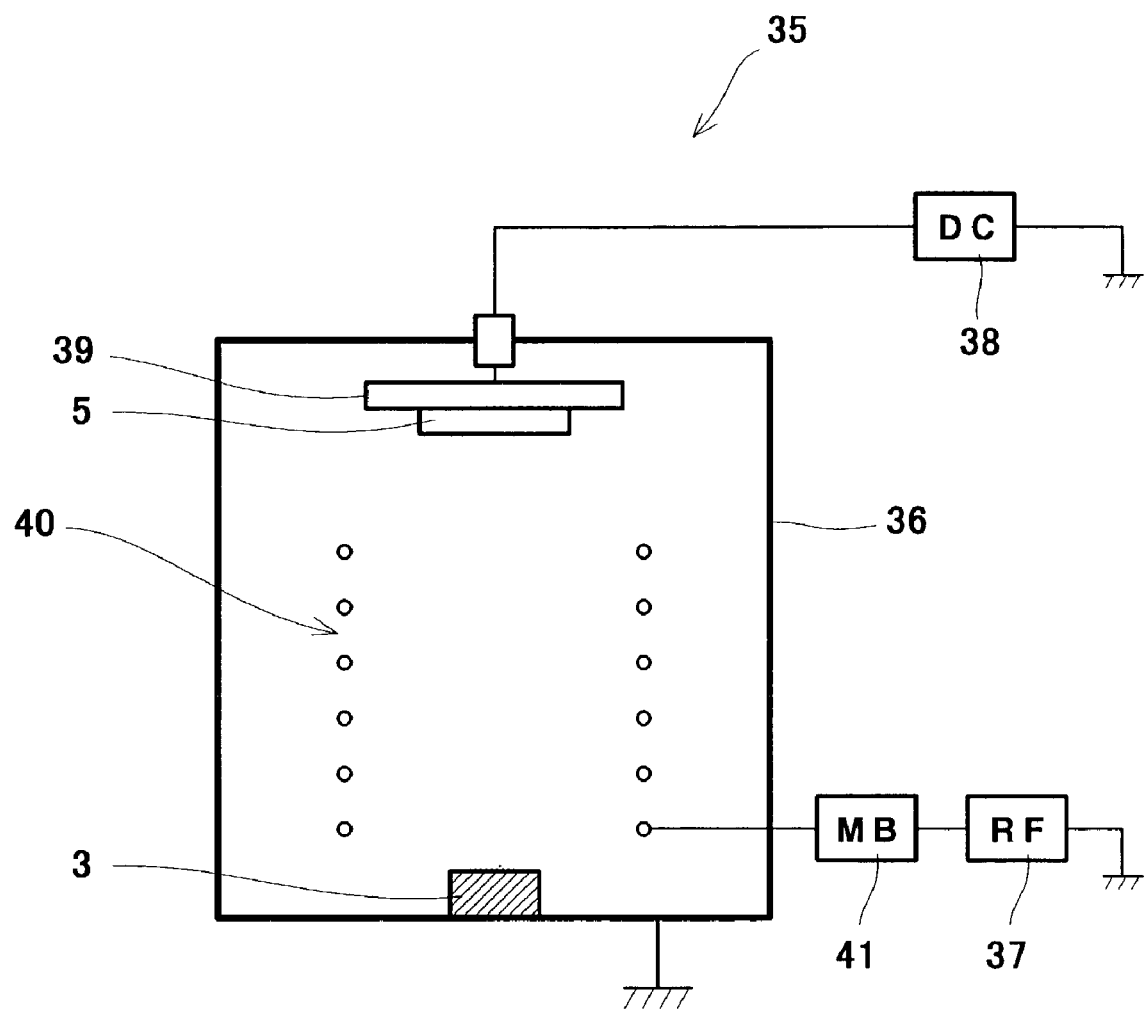
FIG. 5 is a schematic view showing a configuration of another film deposition system capable of manufacturing the optical system in FIG. 1.

The film deposition system capable of manufacturing the optical system 101 of this embodiment is not intended to be limited to the above-mentioned film deposition system 10. FIG. 5 is a view showing a configuration of another film deposition system 35 capable of manufacturing the optical system 101. The film deposition system 35 is adapted to deposit the film by ion plating, as in the case of the film deposition system 10. The film deposition system 35 comprises a vacuum chamber 36, an RF power supply (RF) 37, and a bias power supply unit (DC) 38.

In an upper portion inside the vacuum chamber 36, a substrate holder 39 is placed for holding a substrate 5 from its back-surface side that is opposite to its front surface on which a film is to be deposited. In an example in FIG. 5, the substrate holder 39 is capable of functioning as a bias supply electrode for supplying the bias voltage to the inside of the vacuum chamber 36. The substrate holder 39 is made of an electrically conductive material, and a bias voltage from the bias power supply unit 38 is applied to the substrate holder 39.

The bias power supply unit 38 is capable of outputting a DC voltage having a constant positive value as the bias voltage. By applying the bias voltage output from the bias power supply unit 38 to the substrate holder 39, negatively-charged fluoride ions can be incorporated into the substrate 5.

In a lower portion inside the vacuum chamber 36, an evaporation source 3 is provided for holding a film material made of fluoride and evaporating the material in a space inside the chamber 36. The evaporation source 3 is constituted in the same manner as the evaporation source 3 of the film deposition system 10.

Inside the vacuum chamber 36, a coil-shaped ionization electrode 40 is placed between the evaporation source 3 and the substrate 5. The coil-shaped ionization electrode 40 is connected to the RF power supply 37 to allow a RF power to be supplied to the inside the chamber 36 through the ionization electrode 40.

The RF power supply 37 has output terminals. One of the output terminals is connected to the ionization electrode 40 through a matching box 41 and the other output terminal is electrically grounded. The matching box 41 is constituted by a well-known matching circuit comprising a capacitor, a coil, etc. The adjustment of the matching circuit enables matching between impedance on the side of the RF power supply unit 37 and impedance on the side of the vacuum chamber 36. The RF power supply 37 is adapted to supply a RF power for generating the plasma, in order to ionize the material of the film evaporated from the evaporation source 3 and passing the inner side of the ionization electrode 39.

The vacuum chamber 36 is evacuated by an evacuation means such as a vacuum pump and a gas supply means (not shown) so that its inner space has a desired vacuum atmosphere. That is, the vacuum chamber 36 is freely adjusted to have a desired vacuum atmosphere meeting film deposition conditions.

Using the film deposition system 35 described above, the film can be deposited as described below. The evaporation source 3 is filled with a film material made of fluoride and the substrate 5 is set on the substrate holder 39. Then, while evaporating the fluoride from the evaporation source 3, the RF power supply 37 is operated, thereby supplying a RF power to the inside of the chamber 1 through the ionization electrode 40 and further, the bias power supply unit 38 is operated, thereby applying a positive DC voltage to the substrate holder 39. As a result, plasma is generated in a space surrounded by the ionization electrode 40. The fluoride evaporated from the evaporation source 3 is ionized (excited) by the plasma, and fluoride ions are incorporated into and adheres to the substrate 5, thus depositing a fluoride film on the surface of the substrate 5.

In a process of depositing the film on the substrate 5 using the film deposition system 35, fluorine atoms with weak chemical bond are easily dissociated from the ionized fluoride. However, since the DC voltage output from the bias power supply unit 38 is applied to the substrate holder 39, negatively-charged fluorine ions can be incorporated into the substrate 5.

Subsequently, preferred deposition conditions of the film deposition system 10 described above and characteristics of the fluoride film obtained by the film deposition system 10 will be described. In an example described below, a magnesium fluoride thin film is deposited on a glass substrate or a quarts substrate.

Figure 6:
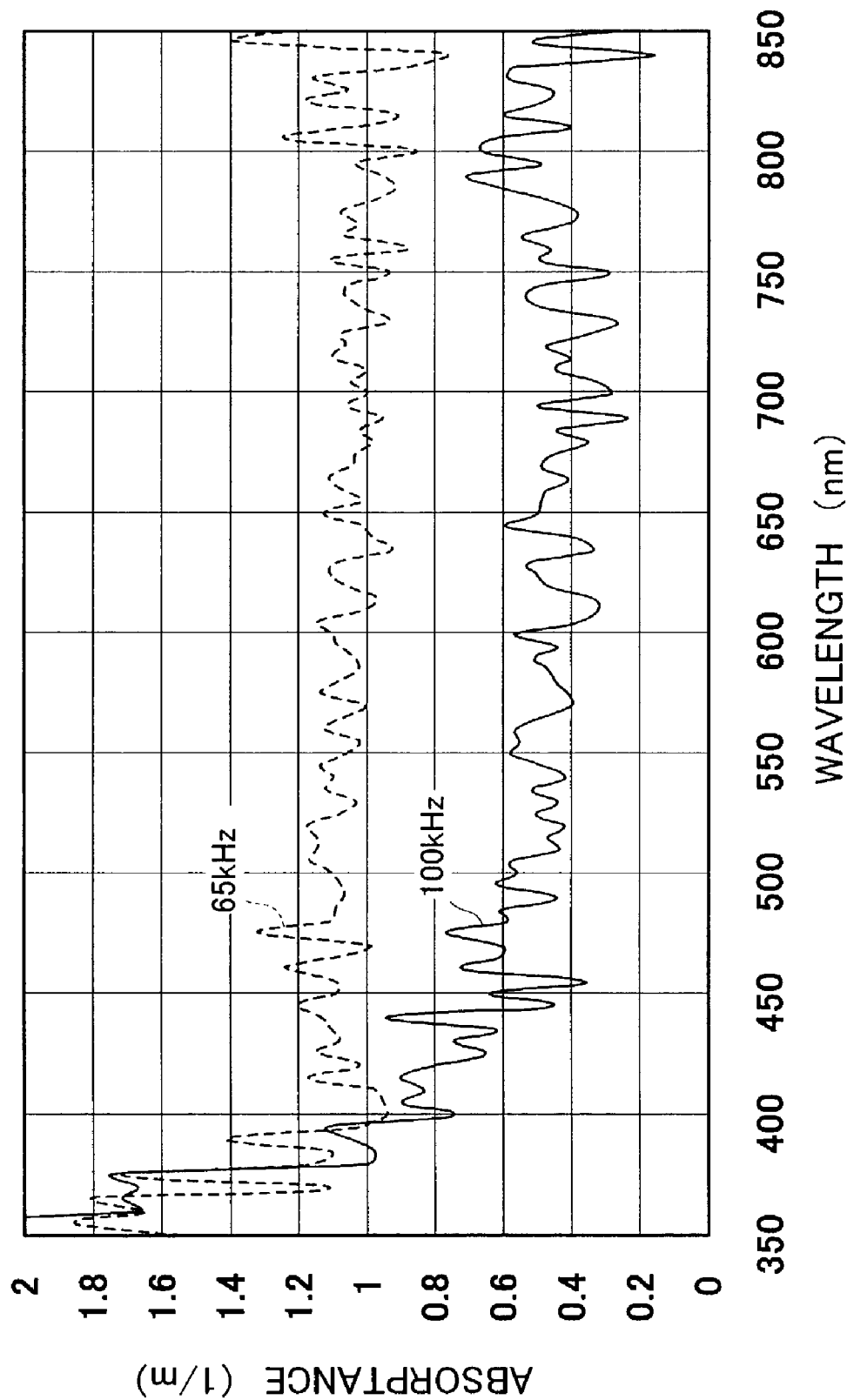
FIG. 6 is a graph showing dependency of absorptance of an optical filter obtained by forming a magnesium fluoride thin film on a glass substrate, with respect to a pulse frequency of the bias voltage.

FIG. 6 is a graph showing dependency of absorptance of an optical filter obtained by depositing the magnesium fluoride thin film on the glass substrate, with respect to pulse frequencies of the pulse voltage. In FIG. 6, a lateral axis and a longitudinal axis represent light wavelength and absorptance, respectively. The bias voltage in the waveform in FIG. 2B is varied to have two levels of pulse frequencies of 65 kHz and 100 kHz as parameters. As a result, as shown in FIG. 6, an optical filter obtained using the bias voltage at 100 kHz exhibited absorptance significantly lower that of an optical filter obtained using the bias voltage at 65 kHz, i.e., satisfactory absorptance.

Figure 7:
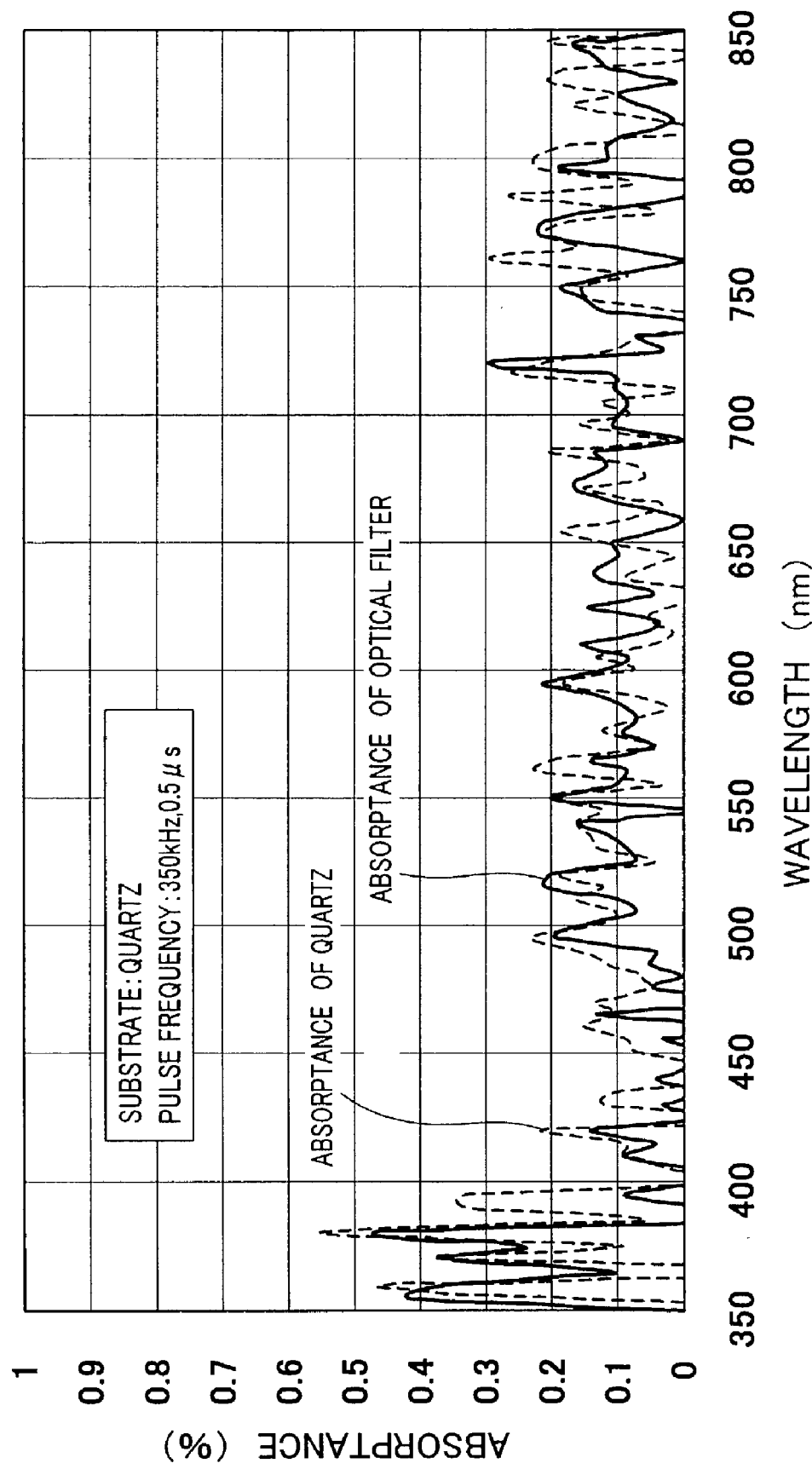
FIG. 7 is a graph showing absorptance of light in a visible light region of an optical filter obtained by forming the magnesium fluoride thin film on a quarts substrate.

With the pulse frequency of 65 kHz, absorptance is almost equal to that of the optical filter obtained without applying a positive bias, which is not shown in this example. FIG. 7 is a graph showing absorptance of light of an optical filter on a quarts substrate at a pulse frequency of 350 kHz, which will be described later. Although the use of pulse frequency of 350 kHz or higher is not illustrated, it is theoretically preferable that a positive bias period exists in the shortest possible cycle and at the shortest possible intervals. Therefore, a higher pulse frequency is favorable. It should be noted that, if the pulse frequency becomes too high, plasma discharge in the vacuum chamber becomes unstable. In view of this, it is practically desirable to set the pulse frequency to 2.45 GHz. When the pulse frequency is 2.45 GHz, it is desirable to use an ECR (electron cyclotron resonance) device.

FIG. 7 is a graph showing absorptance of light in a visible light region of an optical filter obtained by depositing the magnesium fluoride thin film on the quarts (silica) substrate. Herein, the pulse frequency of the bias voltage for film deposition is set to 350 kHz. The absorptance of the optical filter (indicated by a solid line in FIG. 7) is lower than the absorptance of the optical filter in FIG. 6, because of combined effects of setting the pulse frequency of the bias voltage to 350 kHz and using the quarts substrate. For reference, the absorptance of quarts is indicated by a dashed line in FIG. 7.

FIG. 8 is a table showing a crystal grain diameter of the magnesium fluoride thin film. As shown in FIG. 8, the crystal grain diameter of the magnesium fluoride thin film deposited at 300° C. is 12–30 nm (nanometer). The magnesium fluoride thin film deposited at normal temperature without heating the substrate was not crystallized, and it is therefore impossible to calculate the crystal grain diameter. In contrast, the crystal grain diameter of the magnesium fluoride thin film deposited by the film deposition system 10 is 3–10 nm. As evident from above, the magnesium fluoride thin film according to this example has a crystal grain diameter that has not been conventionally obtained. This is mainly because the magnesium fluoride thin film of this example is formed at a relatively low temperature (100° C. or lower) by ion plating.

Figures 9A, 9B:
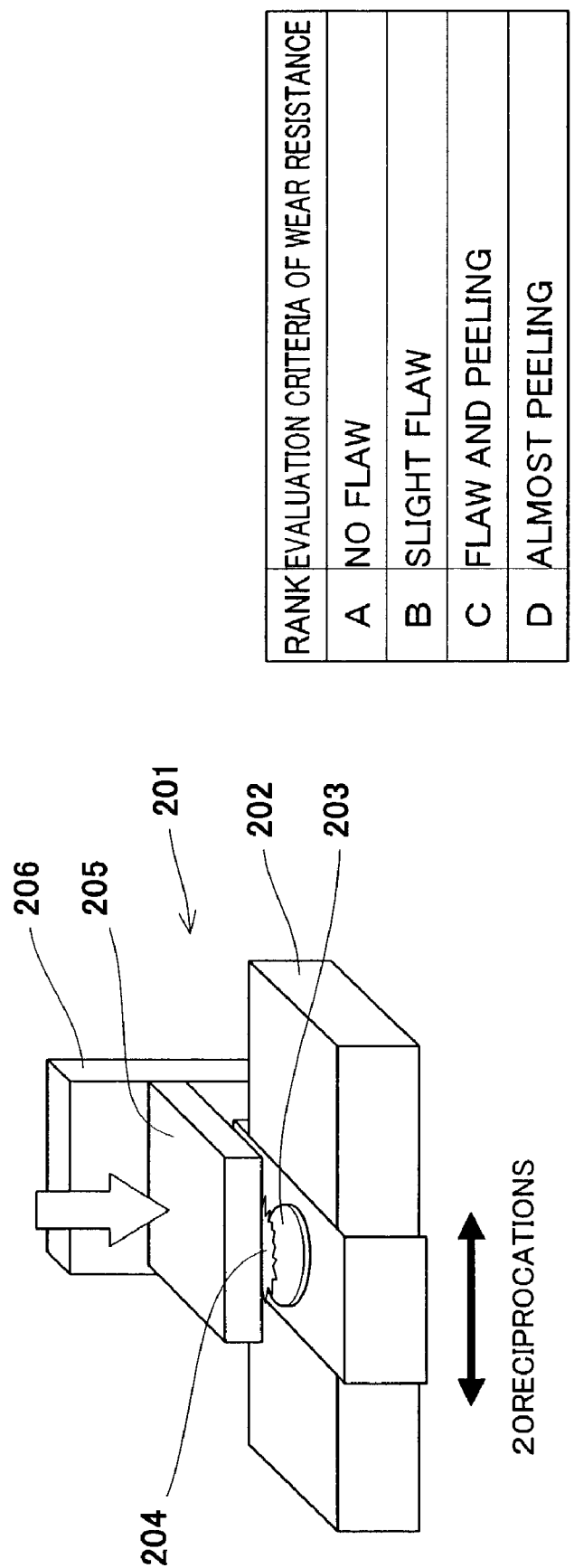
FIG. 9A is a perspective view schematically showing a configuration of a wear-resistance tester.
FIG. 9B is a view showing evaluation criteria of wear resistance.

FIG. 9A is a perspective view schematically showing a configuration of a wear-resistance tester, and FIG. 9B is a view showing evaluation criteria of wear resistance.

As shown in FIG. 9A, the wear-resistance tester comprises a movable base 202 capable of reciprocation, an arm 206 vertically provided on the backside of the movable base 202, and a press element 205 held by the arm 206 so as to be located above the movable base 202 and provided with a steel wool 204 (steel wool of #0000) on a underpart thereof opposed to the movable base 202. When a wear-resistance test is carried out, a sample (substrate provided with a thin film) 203 is placed on an upper surface of the movable base 202 and the press element 205 is lowered to cause the sample to be pressed by a predetermined load (e.g., 700 g). Then, the movable base 202 is reciprocated to allow an upper surface of the sample 203 to be frictionized by the steel wool 204.

The wear resistance is rated at four ranks A-D as shown in FIG. 9B: rank A indicating "a film state with no flaw", rank B indicating "a film state with slight flaw", rank C indicating "a film state with flaw and peeling", and rank D indicating "a film state almost peeled".

In addition to the above-mentioned characteristics, the magnesium fluoride film deposited by the film deposition system 10 in FIG. 2A has a specific surface area of 1–5 m$^2$/g and has optical characteristic in which a refractive index is less likely to vary irrespective of environmental conditions. Such an optical characteristic of the magnesium fluoride film is considered to be brought about for the reasons described below. When depositing the magnesium fluoride film, the positively-charged fluoride ions and the negatively-charged fluorine ions acceleratively move toward the substrate 5 and impinge onto the surface of the substrate 5 on which the film is deposited, as mentioned previously. This impingement is considered to cause two phenomena, i.e., crystal growth and crystal breakage on the surface of the substrate 5 on which the film is deposited.

In actuality, according to SEM photograph of a surface layer of the deposited magnesium fluoride film, column-shaped crystal is formed as in the case of the conventional film, but protruded crystallinity is not found from X-ray diffraction peak in contrast with the conventional film. This implies occurrence of the two phenomena. As a result of simultaneous occurrence of these two phenomena, it is expected that growth of crystal grains, crystal columns, and the like, which generally increase the specific surface area of the film, is suppressed, and the specific surface area of the magnesium film of this example is relatively small.

Accordingly, the inventors of the present invention actually measured the specific surface area of the magnesium fluoride film. The specific surface area was measured by a gas absorption method using a Kr gas. The method of measuring the specific surface area include a weight method, a liquid absorption method, the gas absorption method, and the like, among which the gas absorption method is relatively easy and highly precise.

Hereinbelow, the outline of the gas absorption method will be described. A surface area S per unit weight (specific surface area) which is obtained by the gas absorption method is given by the following formula (1):

$$S = Nm \times \sigma \quad (1)$$

where Nm is absorption amount of monomolecular layer, and σ is a cross-sectional area of absorbed molecules.

Adjacent atoms are less in atoms existing on the film surface than in atoms existing inside the film, and to eliminate such imbalance, the atoms on the film surface tend to attract gas molecules around themselves. This phenomenon is called the gas absorption. Assuming that absorbed molecules are arranged without clearance on the film surface by the gas absorption, the film surface area can be calculated based on the number of absorbed molecules occupying the film surface and the cross-sectional area occupied by one absorbed molecule. Preferably, the absorbed molecules are inactive, do not chemically react with the film surface, and have a small diameter to permit the molecules to be filled in concave portions of concave/convex portions of the film surface. In this embodiment, the absorbed molecules are preferably smaller than water molecules. Therefore, in this embodiment, Kr molecules are used.

To calculate the surface area S, it is necessary to obtain the number of absorbed molecules occupying the surface. To this end, B.E.T formula is used in this embodiment. The B.E.T formula is given by the following formula (2):

$$P/V(P_o-P) = 1/Vmc + (C-1)/Vmc \times P/P_o \quad (2)$$

where V is the number of absorbed molecules, Vm is absorbed amount of monomolecules, P is absorption equilibrium pressure, $P_o$ is a saturated vapor pressure, and C is a constant.

Prior to actual calculation of the surface area, initially, the magnesium fluoride film is heated in vacuum for the purpose of eliminating impurities such as water adhering to the surface of the magnesium fluoride film according to this embodiment. The heated magnesium fluoride film is cooled to a predetermined temperature in a vacuum container and the Kr gas is introduced stepwise. With the stepwise introduction of the Kr gas, the Kr gas is absorbed into the surface of the magnesium fluoride film. During this step, an absorption constant-temperature line obtained by plotting the pressure in the container and the absorbed amount of Kr molecules is created, and based on the absorption constant-temperature line and the formulae (1), (2), the surface area is calculated.

As a result, it is revealed that the specific surface area of the conventional magnesium fluoride film created by the vacuum evaporation is greater than 10 m$^2$/g, whereas the specific surface area of the magnesium fluoride film of this example is approximately 1–5 m$^2$/g. Therefore, as expected above, the specific surface area of the magnesium fluoride film is extremely smaller than that of the conventional film. In addition, the magnesium fluoride film is expected to have a dense higher-order structure and a smooth surface in contrast with the conventional film.

In this magnesium fluoride film, water molecules are less likely to enter between crystals, and hence amount of water absorbed in the film is less, because of its specific surface area smaller than that of the conventional film. It follows that the film is less affected by environmental conditions such as humidity and temperature and has optical characteristic in which a refractive index is less likely to vary.

For reference, in general, glass has a specific surface area of approximately 1 m$^2$/g. Therefore, the magnesium fluoride film of this embodiment having a specific surface area of 1–5 m$^2$/g is satisfactory to suppress variation in the refractive index due to water absorption, and exhibits superior optical characteristic when used in various types of optical systems.

Figure 10B:
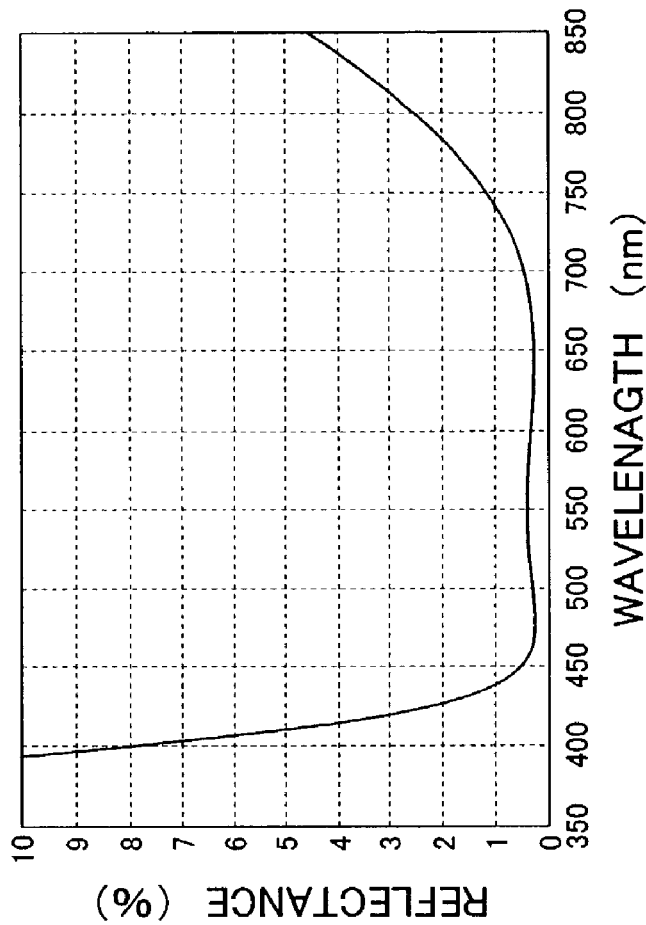
FIG. 10B is a table showing a reflectance in a visible light region of the multilayered film in FIG. 10A.
Figure 10A:
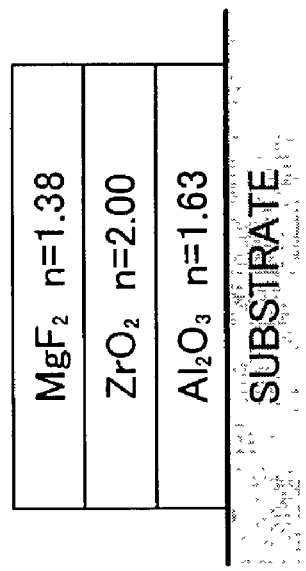
FIG. 10A is a view showing a structure of a multilayered film to which the optical system of the first embodiment is applied.

FIGS. 10A, 10B are views showing that the optical system of this embodiment applied to a multilayered film, in which FIG. 10A is a view showing a structure of the multilayered film and FIG. 10B is a view showing reflectance in a visible light region of the multilayered film formed on the substrate. As shown in FIG. 10A, the multilayered film of this example is structured such that Al$_2$O$_3$ (refractive index n=1.63) film, ZrO$_2$ (refractive index n=2.00) film, and MgF$_2$ (refractive index n=1.38) film are disposed on the substrate in this order. The reflectance of the multilayered film is satisfactory as shown in FIG. 10B. When depositing the multilayered film using the film deposition system 10 in FIG. 2A, evaporation sources including the three film materials are prepared and are sequentially used, thereby sequentially depositing the respective films on the substrate.

Embodiment 2

A second embodiment of the present invention illustrates that the optical system of the present invention applied to a dielectric multilayered film reflector used in a display.

Figure 11:
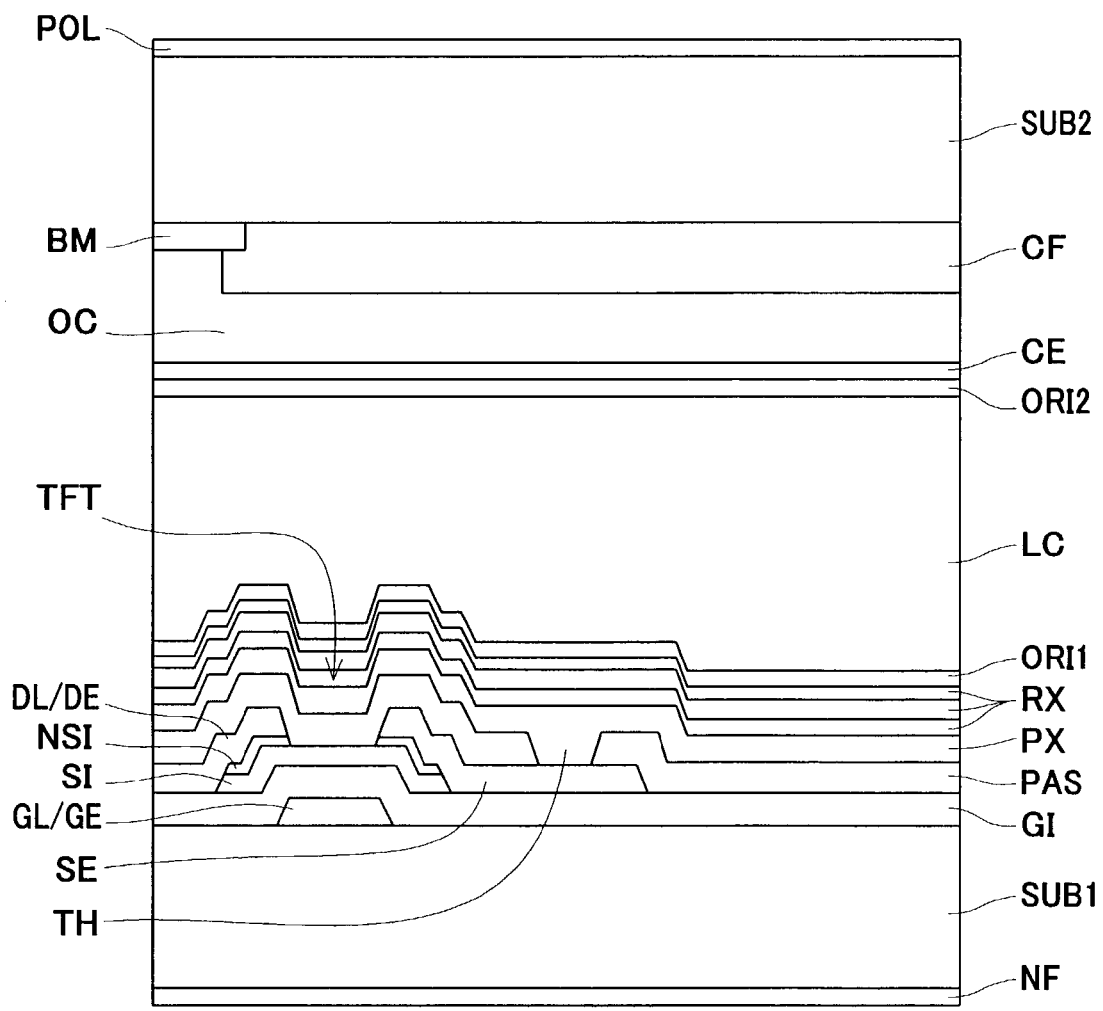
FIG. 11 is a cross-sectional view showing an active matrix type liquid crystal display to which an optical system according to a second embodiment is applied.

FIG. 11 is a cross-sectional view showing an active matrix type liquid crystal display to which the optical system according to the second embodiment is applied. The liquid crystal display according to this embodiment is a transflective reflective liquid crystal display.

In FIG. 11, SI denotes a semiconductor layer, PX denotes a pixel electrode, TFT denotes a thin film transistor, DE denotes a drain electrode of the thin film transistor (a video signal electrode), SE denotes a source electrode of the thin film transistor, GE denotes a gate electrode of the thin film transistor, and TH denotes a through hole through which the source electrode is electrically connected to the pixel electrode. Further, POL denotes a polarizer, SUB1, SUB2 denote transparent insulating substrates, BM denotes a light-shielding pattern, CF denotes a color filter, OC denotes an overcoating film, CE denotes a common electrode, LC denotes a liquid crystal layer, ORI1, ORI2 denote alignment layers, GI denotes a gate insulating film, PAS denotes a surface protection film of the thin film transistor, NSI denotes an electrode for enabling a contact between the source electrode and the semiconductor layer SI, and between the drain electrode and the semiconductor layer SI, RX denotes a dielectric multilayered film reflector made of SiO$_2$, SiN, MgF$_2$, and NF denotes a retardation film.

The transparent insulating substrate SUB1 on which the thin film transistor TFT is provided is called a TFT substrate. The transparent insulating substrate SUB2 which is opposed to the TFT substrate with the liquid crystal layer LC interposed therebetween is called a CF substrate.

As shown in FIG. 11, in this embodiment, the CF substrate (transparent insulating substrate) SUB2 is provided with the light-shielding pattern BM formed in a gap of the pixel electrode on the TFT on a surface on the side of the liquid crystal layer LC so as to define each pixel region. The color filter CF is formed in an opening of the light-shielding pattern BM that defines a substantial pixel region. The overcoating film OC comprised of, for example, a resin film, covers the light-shielding pattern BM and the color filter CF. The common electrode CE is formed on a surface of the overcoating film OC and the alignment layer ORI2 is formed on a surface of the common electrode CE. The polarizer POL is formed on an outer surface (a surface on the opposite side of the liquid crystal layer LC) of the substrate SUB2.

An inverted-stagger thin film transistor TFT is provided on the CF substrate SUB2 on the side of the TFT substrate SUB1. In the thin film transistor TFT, upon application of a voltage more than a threshold of the thin film transistor TFT to a scan signal line GL, the semiconductor layer SI is caused to be in a continuity state, thereby allowing the video signal electrode DE and the source electrode SE to be in a continuity state. At this time, the voltage being applied to the video signal line DE is sent to a pixel electrode PX. When the voltage of the scan signal line GL is less than the threshold of the thin film transistor TFT, the video signal electrode DE is insulated from the source electrode SE, so that the voltage being applied to the video signal line DL is not sent to the pixel electrode PX, which holds the voltage transmitted during the continuity state between the video signal electrode DE and the source electrode SE. Between the video signal electrode DE and the silicon layer SI, and the source electrode SE and the silicon layer SI, the electrode NSI comprised of a silicon film doped with an impurity such as phosphorus is provided.

The through hole TH is formed in the surface protection film PAS of the thin film transistor TFT. The pixel electrode PX is electrically connected to the source electrode SE through the through hole TH. The pixel electrode PX also has a capability of reflecting light incident from the side of the polarizer POL, and display is performed using this reflected light.

The alignment layers ORI1, ORI2 have surfaces which have been subjected to rubbing process and serve to align liquid crystal molecules of the liquid crystal layer LC along a predetermined direction.

The polarizer POL has a capability of converting the incident light into linearly polarized light. The light incident from the side of the polarizer POL travels through the liquid crystal layer LC and is reflected on the dielectric multilayered film RX, and the resulting reflected light re-travels through the liquid crystal layer LC and reaches the polarizer POL. The liquid crystal layer LC has a refractive index anisotropy, the characteristic of which is varied by an electric field applied to the liquid crystal layer LC.

In the case of a normally-white-mode liquid crystal display which is adapted to perform white display in the state in which no electric field is applied to liquid crystal, light which travels through the polarizer POL, is reflected on the dielectric multilayered film RX, and returns to the polarizer POL while the electric field is applied to the liquid crystal layer LC, becomes polarized light parallel to an absorption axis of the polarizer POL as the result of traveling through the liquid crystal layer LC. This polarized light is absorbed by the polarizer POL, and therefore, does not emanate to the outside of the reflective liquid crystal display, thereby resulting in black display. On the other hand, in the state in which the electric field is not applied to the liquid crystal layer LC, the light which is reflected on the dielectric multilayered film RX and returns to the polarizer POL becomes polarized light perpendicular to the absorption axis of the polarizer POL as the result of traveling through liquid crystal layer LC. This polarized light is absorbed by the polarizer POL, and therefore, does not emanate to the outside of the reflective liquid crystal display, thereby resulting in white display.

Also, by using light from a backlight (not shown) placed on the side of the TFT substrate SUB1, display can be performed without ambient light in such a manner that the light is circularly polarized by the retardation film NF or the like before the light reaches the pixel electrode PX. The transmittance of the pixel electrode PX and the transmittance of the dielectric multilayered film RX can be changed into desired ones by controlling the film thickness of the dielectric multilayered film RX. While there is a trade-off relationship between the transmittance and reflectance of the dielectric multilayered film RX, the dielectric multilayered film RX constitutes the optical system of this embodiment, and has the relatively low absorptance as described above with reference to FIG. 10B in the first embodiment. For this reason, the sum of the transmittance and the reflectance can be set to approximately 100%.

Figure 12A:
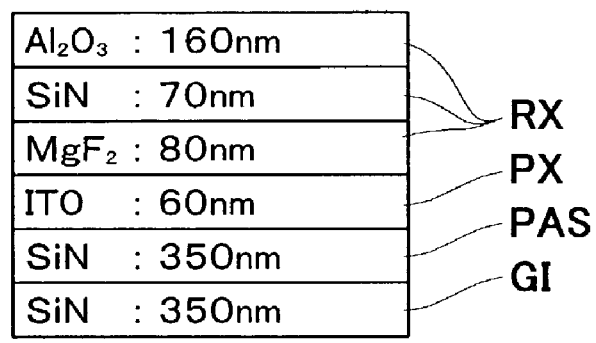
FIG. 12A is a view schematically showing a dielectric multilayered film.
Figure 12B:
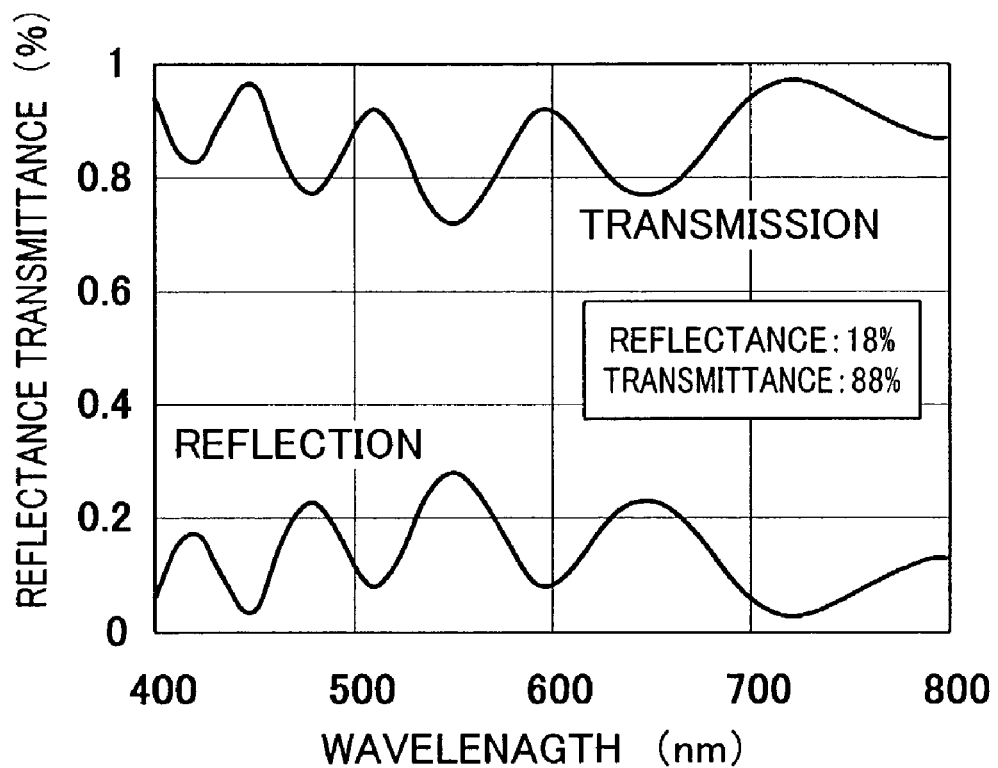
FIG. 12B is a graph showing changes in reflectance and transmittance with respect to a wavelength of the dielectric multilayered film.

FIGS. 12A, 12B show a specific design and optical characteristic of the dielectric multilayered film RX. FIG.

12A is a cross-sectional view schematically showing the dielectric multilayered film RX and FIG. 12B is a graph showing variations in reflectance and transmittance of the dielectric multilayered film RX with respect to a wavelength.

The dielectric multilayered film RX in FIG. 12A is structured such that $Al_2O_3$, SiN, $MgF_2$ films are disposed in this order from the side of the liquid crystal layer LC toward the side of the pixel electrode PX, and their film thicknesses are set to 160 nm, 70 nm, and 80 nm, respectively. Since the pixel electrode PX, the surface protection film PAS of the thin film transistor, and the gate insulating film GI, which are disposed closer to the TFT substrate SUB1 than the dielectric multilayered film RX, respectively contribute the reflection characteristic, their reflection characteristics are taken into account in design of the dielectric multilayered film RX. The pixel electrode PX, the surface protection film PAS of the thin film transistor, and the gate insulating film GI are comprised of ITO, SiN, and SiN, and their thicknesses are set to 60 nm, 350 nm, and 350 nm, respectively. The reflectance and transmittance of the dielectric multilayered film RX in FIG. 12A are 88% and 18%, respectively, thus obtaining satisfactory transmittance as shown in FIG. 12B, when the transmittance takes priority over the reflectance. While the transmittance takes priority over the reflectance in this design, the dielectric multilayered film having desired transmittance and reflectance can be designed by adjusting the number of layers, material, and film thickness of the dielectric multilayered film.

Figure 13:
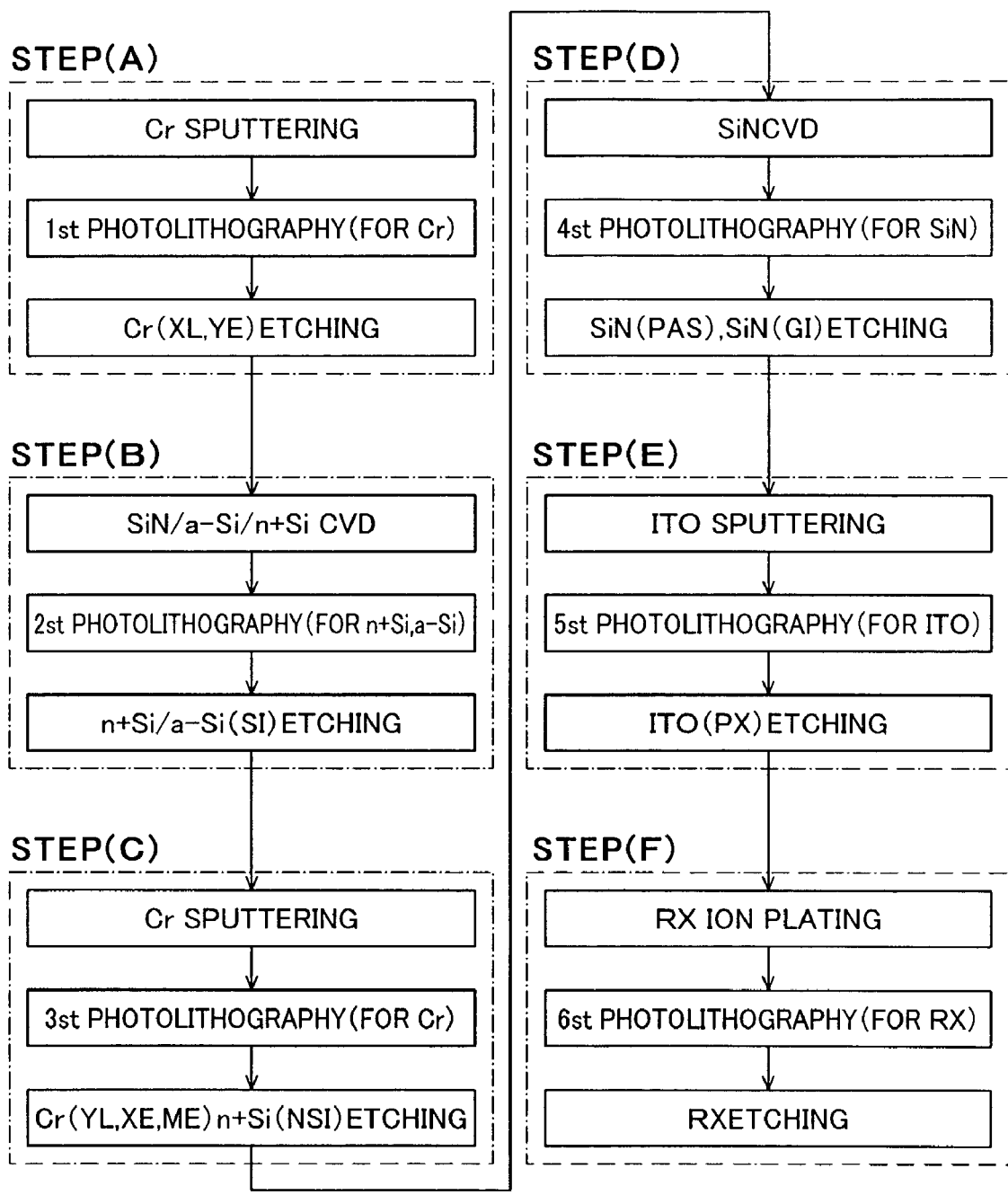
FIG. 13 is a flowchart showing steps of manufacturing a TFT substrate of a liquid crystal display in FIG. 12A.

FIG. 13 is a flowchart showing steps of manufacturing the TFT substrate SUB1 side of the liquid crystal display. Specifically, the TFT substrate SUB1 side of the liquid crystal display is completed through photolithographic steps in six stages (A)–(F). Hereinbelow, how the SUB1 side is manufactured will be explained in the order of steps.

Step (A)

The transparent insulating substrate SUB1 is prepared, and a Cr film is formed to be 100–300 nm, preferably 160 nm thick, over the entire surface, by for example, sputtering. Subsequently, the CR film is etched by photolithography, thereby forming the gate electrode GE, the scan signal line GL, and an extended portion of the scan signal line GL in a region where a scan signal line terminal GTM (not shown) is formed.

Step (B)

Over the entire surface of the transparent insulating substrate SUB1 that has undergone the step (A), a silicon nitride film as the gate insulating film GI is formed to be approximately 200–700 nm, preferably 350 nm thick, by for example, plasma CVD. Over the entire surface of the gate insulating film GI, an amorphous silicon film is formed to be 50–30 nm, preferably 200 nm thick, and further, an amorphous silicon film doped with phosphorus as a n-type impurity is formed to be 10–100 nm, preferably 20 nm thick, by for example, plasma CVD. Subsequently, the amorphous silicon film is etched by photolithography, thereby forming an island-shaped pattern SL in a pixel region.

Step (C)

Over the entire surface of the transparent insulating substrate SUB1 that has undergone the step (B), the Cr film is formed to be 100–300 nm, preferably 160 nm by for example, sputtering. Subsequently, the Cr film is etched by photolithography, thereby forming the drain electrode DE, the source electrode SE, and the video signal line DL of the thin film transistor in the pixel region, and an extended portion of the video signal line DL in a region where the video signal line terminal DTM (not shown) is formed.

Thereafter, using a pattern obtained by etching the Cr film as a mask, the amorphous silicon film doped with phosphorus as the n-type impurity is etched.

Step (D)

Over the entire surface of the transparent insulating substrate SUB1 that has undergone the step (C), a silicon nitride film that becomes the surface protection film PAS of the thin film transistor TFT is formed to be 20 nm–900 nm, preferably 350 nm thick, by for example, plasma CVD. Subsequently, the surface protection film PAS is etched by photolithography, thereby forming the through hole TH for exposing part of the source electrode SE of the thin film transistor TFT in the pixel region. Simultaneously, another through hole TH is formed so as to penetrate the region where the scan signal line GMT (not shown) is formed and reach the gate insulating film GI located under the surface protection film PAS, thereby exposing part of the scan signal line GL. Still another through hole TH is formed in the region where the video signal line terminal DTM (not shown) is formed for exposing the extended portion of the video signal line DL.

Step (E)

Over the entire surface of the transparent insulating substrate SUB1 that has undergone the step (D), a polycrystal ITO film as a transparent conductive film is formed to be 60 nm thick by for example, sputtering. Subsequently, the ITO film is etched by photolithography, thereby forming the pixel electrode PX connected to the source electrode SE through the through hole TH in the pixel region. Pad electrodes for protecting terminals are formed on the scan signal line terminal GMT and the video signal line terminal DMT (not shown), respectively.

Step (F)

Over the entire surface of the transparent insulating substrate SUB1 that has undergone the step (E), $MgF_2$, SiN, $Al_2O_3$ films, are formed to be 80 nm, 70 nm, 160 nm thick, respectively, by using the film deposition system 10 of the first embodiment. Subsequently, the films are etched by photolithography, thereby exposing the scan signal line terminal GTM and the video signal line terminal DMT (not shown).

Through the above-mentioned steps, the TFT substrate SUB1 side is completed.

Meanwhile, on the side of the CF substrate SUB2, the color filter CF produced by a pigment dispersing method and the light-shielding pattern BM made of Cr or an organic material are formed. Thereafter, the overcoating film that becomes a flattening layer is formed. The TFT substrate SUB1 side and the CF substrate SUB2 side are bonded to each other, and the liquid crystal layer LC is filled between them. Further, the polarizer POL is disposed on outer side of the CF substrate SUB2 and the retardation film is disposed on outer side of the TFT substrate SUB1, thereby obtaining a transflective reflective liquid crystal display.

Embodiment 3

A third embodiment of the present invention shows that the optical system of the present invention is applied to an optical waveguide.

Figure 14:
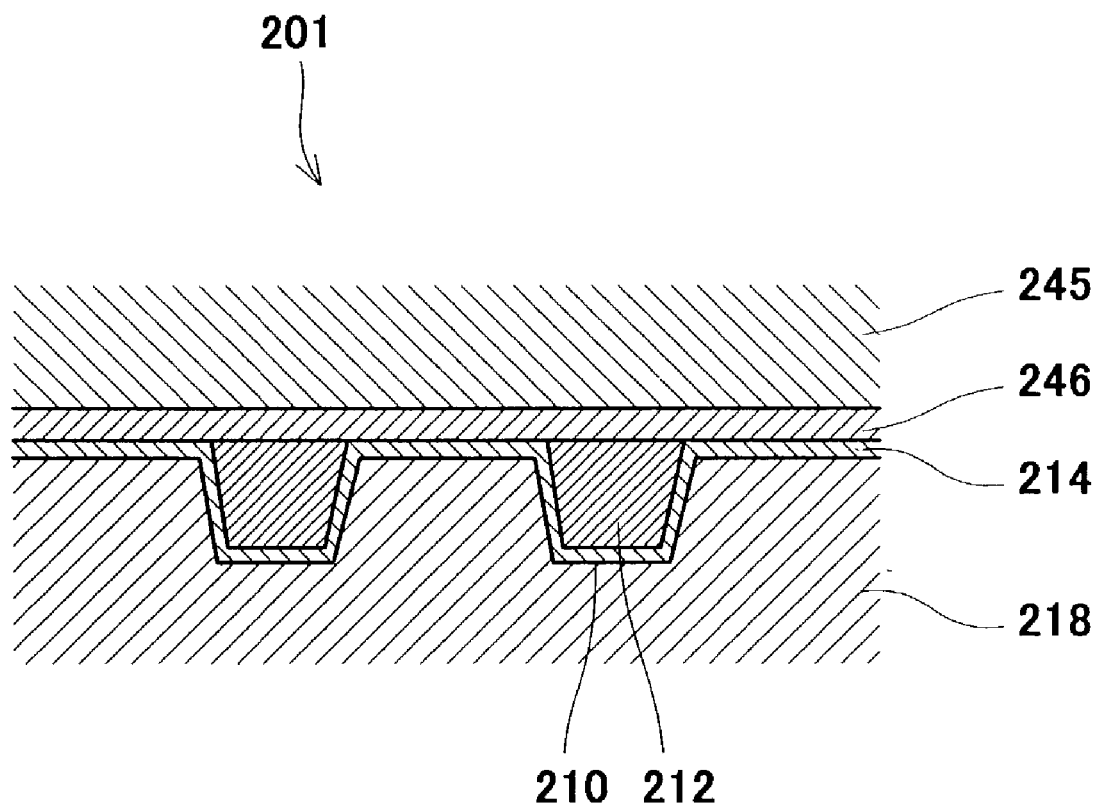
FIG. 14 is a cross-sectional view showing a structure of an optical waveguide as an optical system according to a third embodiment of the present invention.

FIG. 14 is a cross-sectional view showing a structure of the optical waveguide as the optical system according to the embodiment. An optical waveguide 201 comprises an optical waveguide substrate 218 having groove portions 210 and made of a polymer material, a $MgF_2$ (magnesium fluoride) film 214 formed on a surface of the optical waveguide substrate 218, cores 212 made of transparent resin filled in the groove portions 210, a cladding layer 246 serving as a bonding layer between an upper protection plate 245 and the optical waveguide substrate 218, and the upper protection plate 245. The cores 212 have a refractive index higher than those of the MgF$_2$ 214 and the cladding layer 246. The cores 212, the MgF$_2$ film 214 and the cladding layer 246 constitute an optical waveguide portion.

Figure 15:
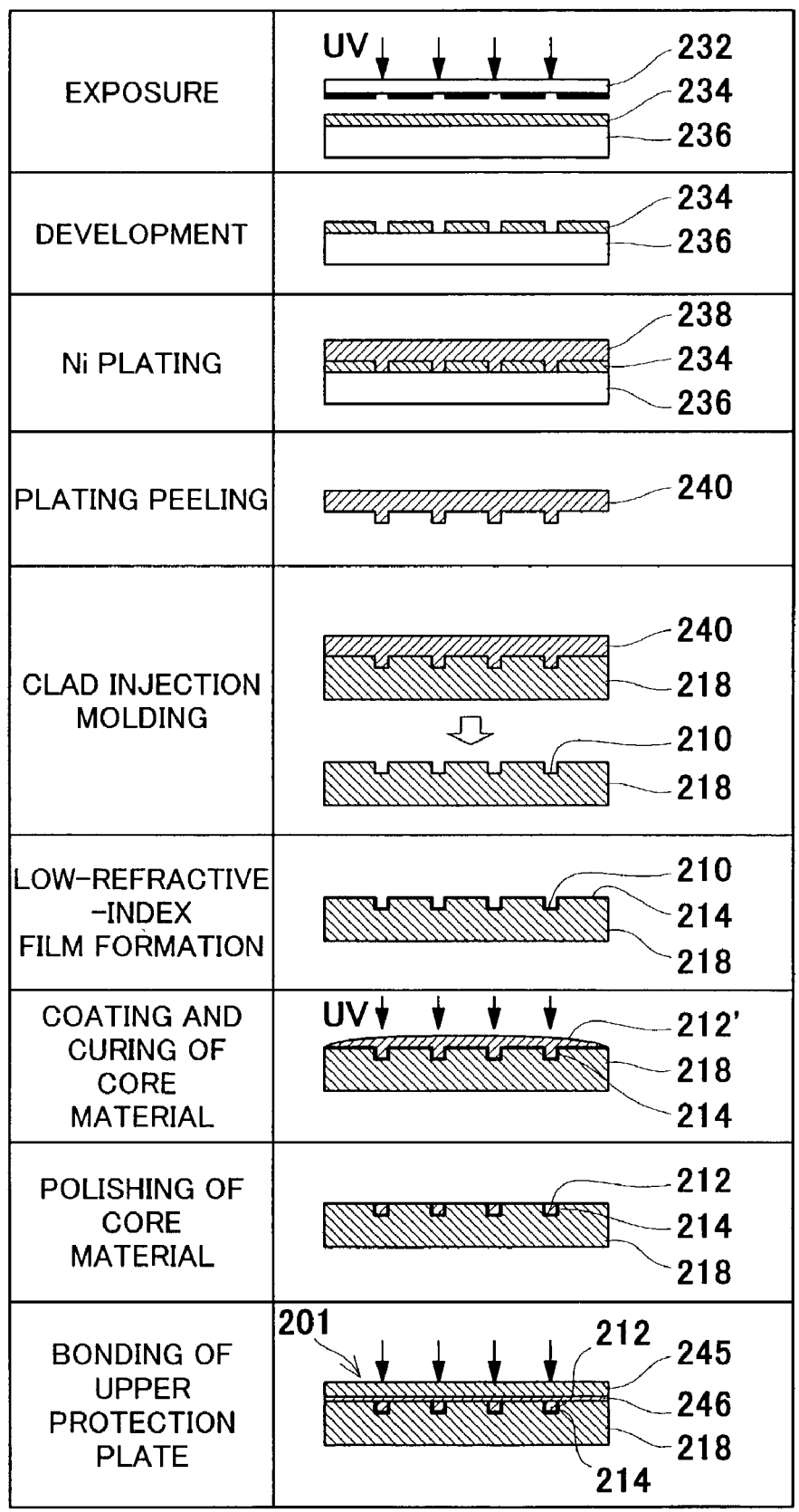
FIG. 15 is a view showing steps of manufacturing the optical waveguide in FIG. 14.

FIG. 15 is a view showing a procedure of manufacturing the optical waveguide 201 of the present invention. First of all, a procedure of manufacturing a mold used in injection molding will be described. A resist 234 coated over a glass substrate 236 is exposed using a mask 232. Then, the resist 234 is developed, thereby removing exposed portion of the resist 234. Then, nickel (Ni) plating 238 is conducted on the resist 234, thereby manufacturing a Ni mold 240. Then, using the mold 240, resin is injection-molded, thereby forming the optical waveguide substrate 218 provided with the groove portions 210 for forming the cores. Then, using the film deposition system 10 of the first embodiment, the MgF$_2$ film 214 is formed on the optical waveguide substrate 218. Following this, a core material 212' is coated so as to fill the groove portions 210 and then cured by irradiation of ultra violet rays or heating. Then, the cured core material 212' is polished to an upper end of the groove portions 210 to eliminate the core material 212' in a region other than the groove portions 210. After polishing, transparent resin that has a refractive index lower than that of the core material 212' and becomes the cladding layer 246 is coated and then the upper protection film 245 is bonded to the cladding layer 246, thereby completing the optical waveguide 210.

In accordance with this embodiment, by using the plasma ion plating of applying the positive pulse bias by the film deposition system 10 of the first embodiment, the MgF$_2$ film 214 that is highly transparent and wear resistant can be formed without heating the optical waveguide substrate 218. As a result, the MgF$_2$ film 214 can be formed on the optical waveguide substrate 218 made of a material with low heat resistance, in particular, resin, and can serve as cladding.

The MgF$_2$ film 214 made of an inorganic material is harder than the core material 212' made of resin and also functions as a polishing stop film in polishing. Specifically, it is difficult to stop polishing at a boundary between the core material 212' and a molded substrate (optical waveguide substrate) 218 without the MgF$_2$ film 214, and hence the molded substrate 218 might get polished, which would lead to shallower groove portions 210. Besides, the depth of groove portions 210 might become non-uniform if the polishing thickness varies. However, in this embodiment, the use of the MgF$_2$ 214 allows the core material 212' to be uniformly polished without reducing the depth of the groove portions 210.

In this embodiment, the optical waveguide substrate 218 is injection-molded using RMMA. In this substrate 218, the MgF$_2$ film 214 is formed over the optical waveguide substrate 218 made of resin, and the core material 212' of liquid transparent resin is coated and cured to be formed into the cores 212. Therefore, a material having a refractive index higher than that of MgF$_2$ film 214 is satisfactory as the material of the cores 212. Consequently, the material of the optical waveguide substrate 218 can be freely selected without considering the material of the cores 212. This makes it possible to use polycarbonate (PC) with a refractive index of 1.59 that has been conventionally difficult to use as the optical waveguide substrate 218 because of its high refractive index. The optical waveguide 201 formed using the PC has heat resistance and moisture resistance higher than that formed using the PMMA. Other than the PMMA and the PC, transparent polymer suitable for molding may be used for the substrate 218 that becomes cladding, including polystyrene, cyclic polyolefin, etc.

Because of presence of the MgF$_2$ film 214 interposed between the core material 212' and the optical waveguide substrate 218, the core material 212' does not react with the optical waveguide substrate 218. So, a material that reacts with or is melted into the material of the optical waveguide substrate 218 can be used as the core material 212', and a material that lessens loss of light can be used as the cores 212. In particular, in order to reduce loss of light in infrared wavelength over which normal resin greatly absorbs light, fluoride containing fluorine substituting for hydrogen is effectively used. Nonetheless, because a refractive index is reduced due to fluorination and becomes lower than that of the molded resin conventionally used in injection molding, the above fluoride has been impossible to use as the core. The MgF$_2$ film 214 has a refractive index as low as approximately 1.38 in the range from visible light to the infrared wavelength, and therefore the resin injection-molded and provided with the MgF$_2$ film 214 on the surface can function as the cladding for the cores 212 with low refractive index. Further, the MgF$_2$ film 214 has a specific surface area as small as 1–5 m$^2$ and therefore has an effect of blocking the entry of water or air into the cores 212. This improves reliability of the optical waveguide.

The injection molding used in this embodiment is substantially similar to known injection molding used in manufacture of an optical disc substrate, and is capable of creating a large quantity of optical waveguide substrates 218 in a short time. In this embodiment, for the purpose of forming the MgF$_2$ film 214 on side surfaces of the groove portions 210, it is desirable to form the side surfaces of the groove portions 210 to be inclined instead of vertical in injection molding. It should be appreciated that the manufacturing method of the optical waveguide 201 is not intended to be limited to the injection molding of this embodiment, but the groove portions 210 for the cores 212 may be formed by press forming or the like.

In this embodiment, the cured core material 212' is polished to minimize the thickness of the core material 212' between the MgF$_2$ film 214 and the cladding layer 246, thereby suppressing leakage of waveguide light. The polishing process may be omitted when the core material 212' between the optical waveguide substrate 218 and the cladding layer 246 can be made sufficiently thin. For example, the core material 212' is cured by heating or irradiation of ultraviolet ray while being pressed from above by the upper protection plate 245, thereby sufficiently reducing the thickness of the core material 212' coated over the region between the optical waveguide substrate 218 and the upper protection plate 245 other than the groove portions 210. In this case, the polishing step and the formation step of the cladding layer 246 may be omitted, and the upper protection plate 245 with low refractive index can be used as the cladding. Alternatively, the core material 212' is coated by blade and the core material 212' on the optical waveguide substrate 218 other than the groove portions 210 is removed by scratching, thus omitting the polishing step.

In this embodiment, the optical waveguide substrate 218 is provided with the groove portions 210 having the cores 212. Alternatively, the optical waveguide may be formed in such a manner that, after forming the MgF$_2$ film on a substrate comprised of a flat resin substrate, the core material is coated over the MgF$_2$ film 214, cured thereon, and then processed by a processing method such as a reactive ion etching, and the cladding is formed on the etched core material. Also in this method, as in the case of this embodiment, the MgF$_2$ film that is highly transparent and wear resistant can be formed on the resin substrate without heating the substrate by using the plasma ion plating of applying the positive pulse bias. Consequently, the material of the resin substrate can be freely selected.

Embodiment 4

A fourth embodiment of the present invention illustrates that the optical system of the present invention is applied to an antireflection coating used in an optical connector.

Figure 16:
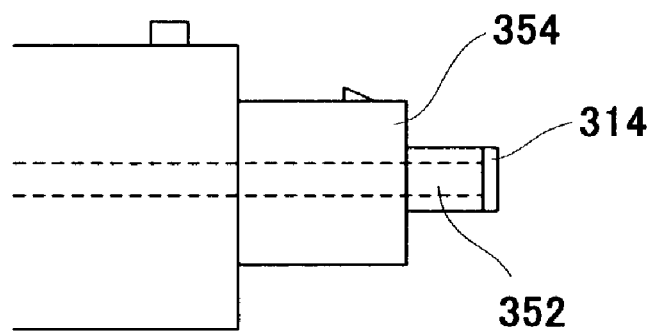
FIG. 16 is a side view of an optical connector using an antireflection coating as an optical system according to a fourth embodiment of the present invention.

FIG. 16 is a side view of the optical connector using the antireflection coating as the optical system of this embodiment. As shown in FIG. 16, an optical fiber 352 is fixed to an optical connector 354, and an antireflection coating 314 comprised of a MgF$_2$ film is formed on a tip end face of the optical fiber 352.

The antireflection coating 314 can be formed without heating the optical fiber 352 by using the plasma ion plating of applying the positive pulse bias described in the first embodiment. As a result, an MgF$_2$ film may be used as an antireflection coating over an optical fiber coated with resin or a plastic optical fiber including a plastic core, as the optical fiber 352.

Further, even after the optical fiber 352 is fixed to the optical connector 354 made of plastic, the antireflection coating 314 can be formed. In particular, in the plastic optical fiber, by forming the antireflection coating 314 comprised of the MgF$_2$ film that is highly wear resistant using the plasma ion plating of applying the positive pulse bias, the antireflection coating 314 and the optical fiber are not damaged and have superior durability even when the optical fibers are connected to each other.

Embodiment 5

A fifth embodiment illustrates that the optical system of the present invention is applied to an antireflection coating used in an objective.

Figure 17:
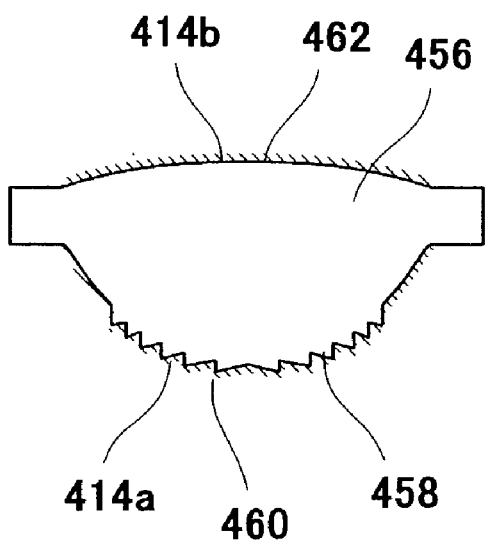
FIG. 17 is a cross-sectional view of an objective using an antireflection coating as an optical system according to a fifth embodiment of the present invention.

FIG. 17 is a cross-sectional view of the objective using the antireflection coating as the optical system of this embodiment. As shown in FIG. 17, hologram 458 is provided on a light incidence face 460 of an objective 456. The objective 456 provided with the hologram 458 is capable of changing a focal point with respect to incident light according to wavelength. The objective 456 is used as a double focusing lens that may serve as an objective of a compact disc (CD) system or an objective of a DVD system.

The objective 456 shown in this embodiment is created by injection molding of transparent resin. The MgF$_2$ film is formed on a surface of the objective 456 using the plasma ion plating of applying the positive pulse bias described in the first embodiment and is comprised of antireflection coatings 414a, 414b.

By the plasma ion plating, the antireflection coatings 414a, 414b can be formed without heating the resin-made objective 456. Since particles to be formed into the film move straight in the vacuum chamber during film deposition, the film can be deposited uniformly in a deep portion of the groove structure of the hologram 458. For the purpose of obtaining the antireflection effect with respect to incident lights having different wavelengths, the reflectance is preferably low in the wavelength of used light, and therefore, the antireflection coating 414a preferably has a dielectric multilayered film structure including a MgF$_2$ film.

In accordance with the plasma ion plating, since the MgF$_2$ film 414a, 414b that is highly wear resistant can be formed without heating the objective 456, the objective 456 can be kept flawless and can be easily cleaned. In the case where the objective 456 is used as the objective of a CD or DVD system, the lens can be kept flawless if the objective should contact the optical disc.

While the objective is used as the double focusing lens provided with the hologram 458, this may be used as an achromatic lens whose focal point does not vary even when the wavelength of the light source varies.

Further, the antireflection coating deposited by the plasma ion plating is not intended to be limited to a lens but may be used on a lens array. For example, a micro lens array may be used with an antireflection coating and used as an integrator, a light valve, or the like in a liquid crystal projector. Besides, the resin molding allows the lens array, a concave mirror, a mirror, prism, and the like to be integrally formed, as well as the hologram. In the optical parts having such a complex structure, satisfactory antireflection coating can be formed because the particles to be deposited can move straight by the plasma ion plating.

Embodiment 6

A sixth embodiment of the present invention illustrates that the optical system of the present invention is applied to an antireflection structure.

Figure 18A:
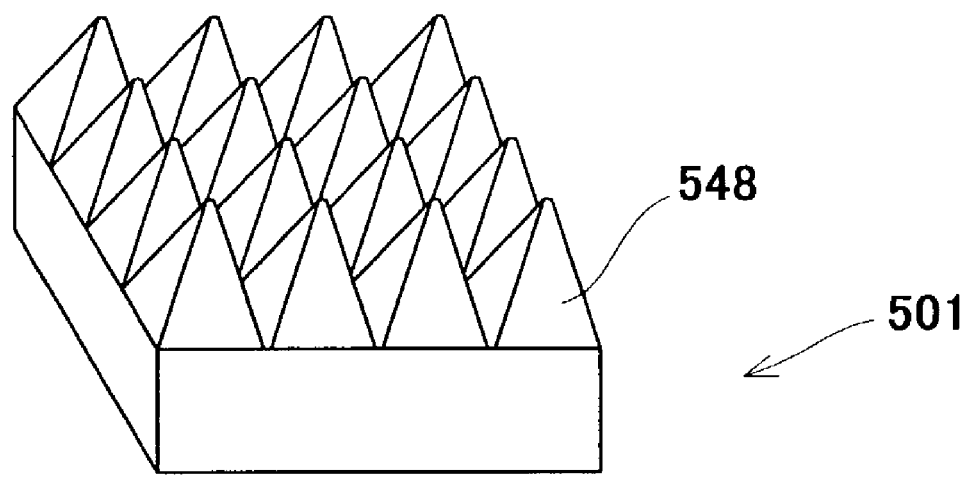
FIG. 18A is a perspective view showing an antireflection structure as an optical system according to a sixth embodiment of the present invention.
Figure 18B:
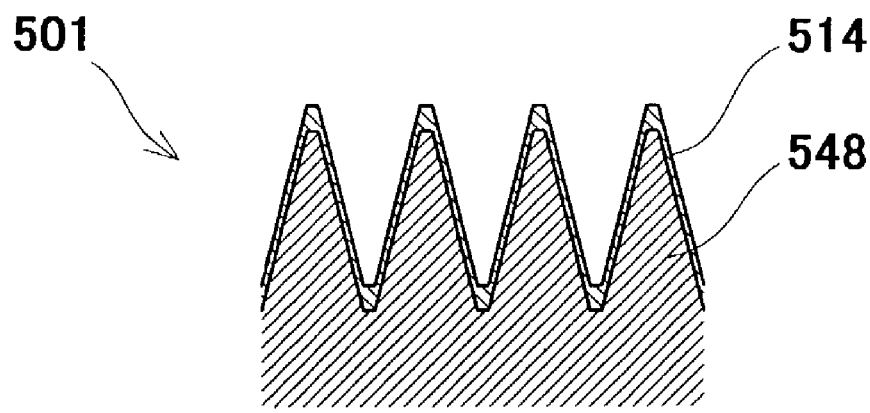
FIG. 18B is a cross-sectional view showing the antireflection structure in FIG. 18A.

FIGS. 18A, 18B are a perspective view and a cross-sectional view showing the antireflection structure as the optical system of this embodiment. In this embodiment in FIGS. 18A, 18B, a resin substrate 501 is formed by injection molding to have a concave/convex surface structure in a period less than a wavelength, thus obtaining an antireflection structure (two-dimensional grating) 548.

The tapered two-dimensional grating 548, with a small grating period that does not cause diffracted light more than first-order but causes only zero-order light, acts as an antireflection structure. While an aspect ratio of the taper that reduces reflectance depends on the refractive index of a medium forming the substrate 501, it is generally preferable that the aspect ratio is set to 1 or larger. Nevertheless, with such a high aspect ratio, steep top or bottom portions are difficult to obtain in the tapered portions, and flat portions tend to occur.

In the case where the top or bottom portions include flat portions and thereby antireflection is insufficient, a MgF$_2$ film 514 with a refractive index lower than that of the substrate 501 is formed on a surface of the substrate 501, thereby reducing the reflectance. By using the plasma ion plating of applying the positive pulse bias described in the first embodiment, the MgF$_2$ film can be formed for the above structure with such a high aspect ratio, without filling the taper structure.

In addition to the above-mentioned antireflection, such a minute structure is formed in an optical element such as a polarizing element or a wavelength selecting filter. So, by forming the MgF$_2$ film 514 on these optical elements, a satisfactory antireflection effect is produced. As a matter of course, the antireflection effect produced by the MgF$_2$ film is effective on a normal transparent diffraction grating or hologram.

Embodiment 7

A seventh embodiment of the present invention illustrates that the optical system of the present invention is applied to a polarizer used in a display.

Figure 19:
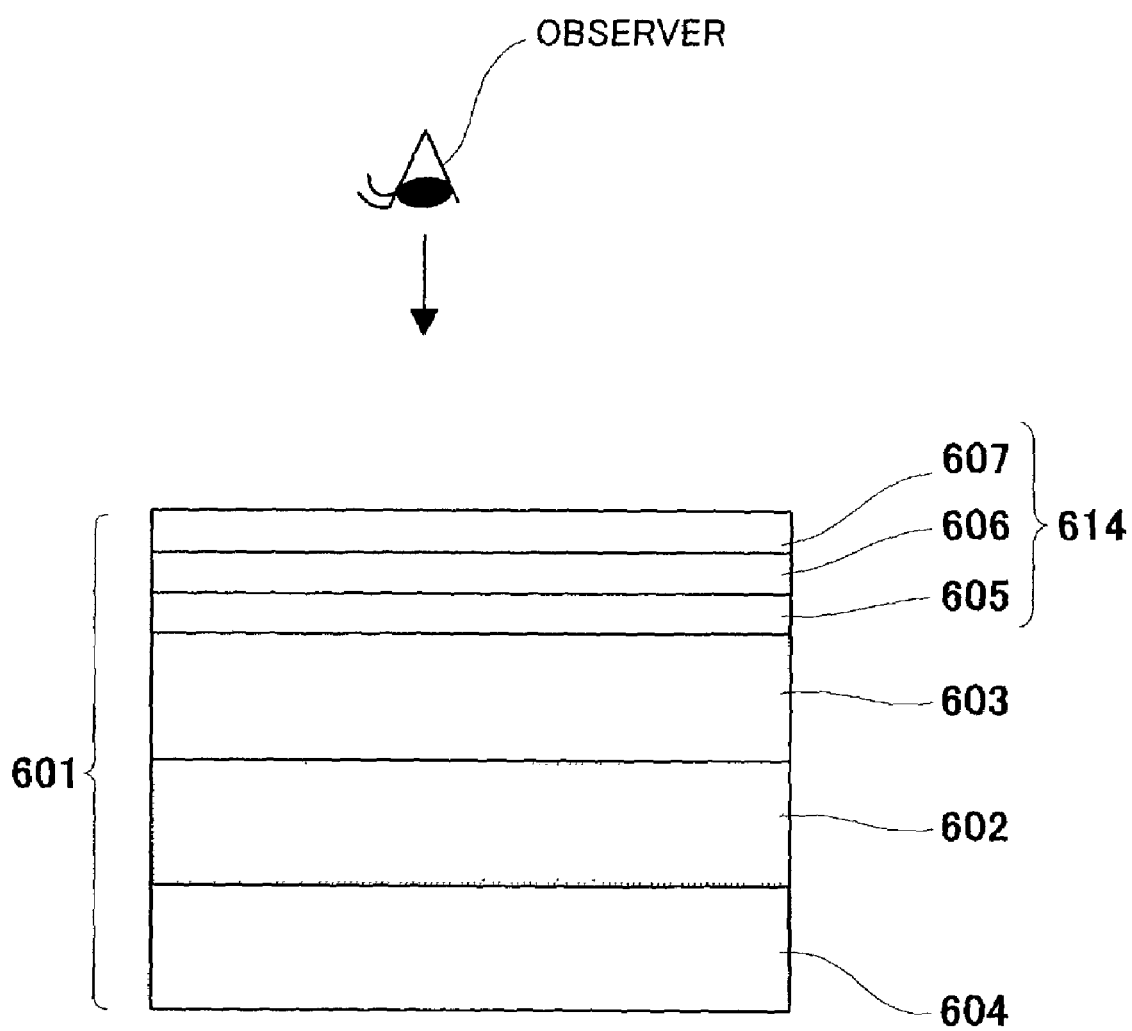
FIG. 19 is a cross-sectional view showing a structure of a polarizer as an optical system according to a seventh embodiment of the present invention.

FIG. 19 is a cross-sectional view showing a structure of a polarizer as the optical system of this embodiment. In FIG. 19, a polarizer 601 of this embodiment comprises a polarizing film 602 obtained by extending a polyvinyl alcohol (PVA) film and absorbing iodine in the film to be given a polarizing capability, and protection films 603, 604 such as triacetylcellulose (TAC) that cover both surfaces of the polarizing film 602 for protecting the polarizing film 602. Instead of iodine, dichroism organic dye may be used for the polarizing film 602.

The polarizer 601 is provided with an antireflection coating 614 on a surface of the protection film 603 on an observer's side. The antireflection coating 614 is structured such that an alumina ($Al_2O_3$) layer 605, a zirconia ($ZrO_2$) layer 606, and a magnesium fluoride ($MgF_2$) layer 607 are formed on the surface of the protection film 603 in this order.

The antireflection coating 614 is formed so as to have thickness that permits reduction in the reflectance in a wide wavelength range due to interference effect using the plasma ion plating of applying the positive pulse bias described in the first embodiment. Since the magnesium fluoride film is deposited at substantially normal temperature, the film that is highly wear resistant and has high transmittance is obtained without degradation of capability of the polarizer 601 which would otherwise occur due to heat. Accordingly, the use of the polarizer 601 can achieve a display that provides a high contrast ratio and satisfactory visibility with relatively less mirroring under bright environment.

Embodiment 8

An eighth embodiment of the present invention illustrates that the optical system of the present invention is applied to an antireflection coating used in a touch panel.

Figure 20:
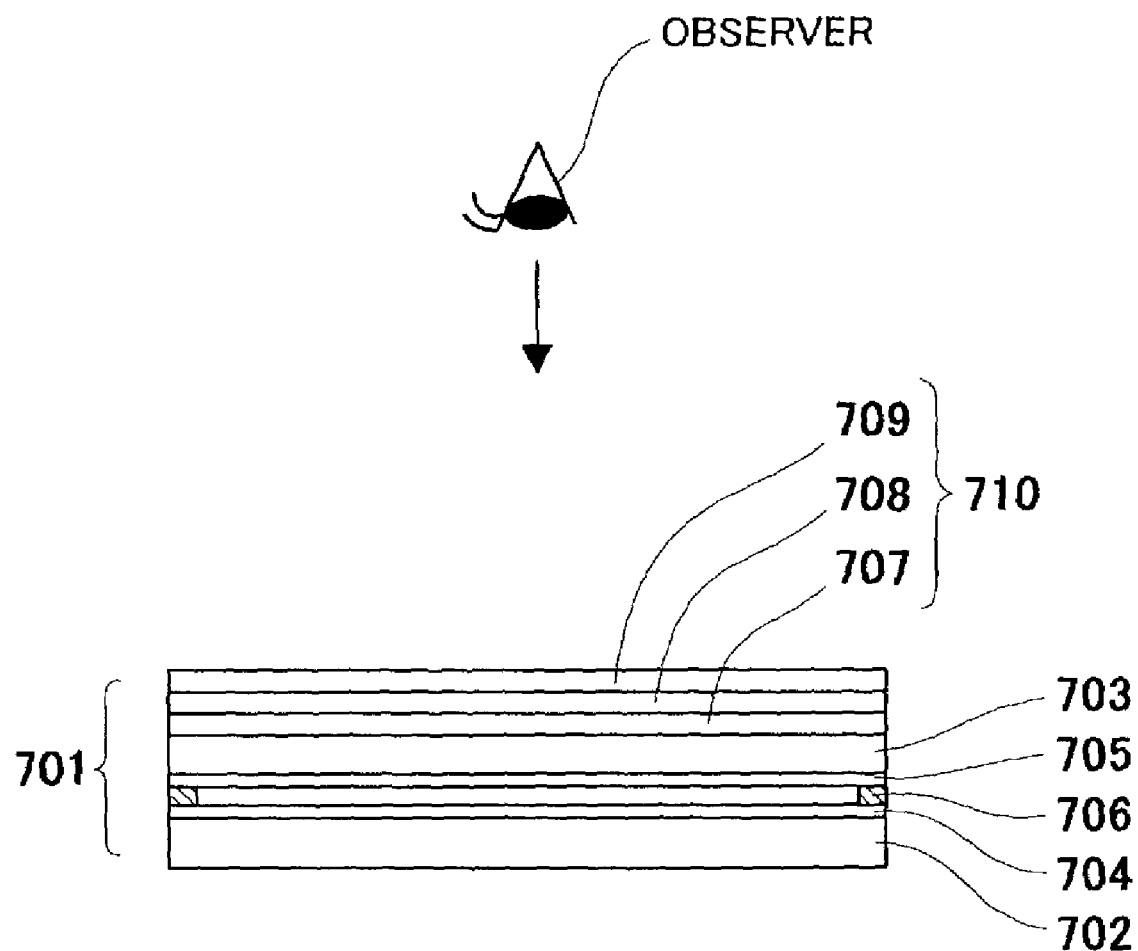
FIG. 20 is a cross-sectional view showing a structure of a touch panel in which an antireflection coating as an optical system according to an eighth embodiment of the present invention is used.

FIG. 20 is a cross-sectional view showing a structure of the touch panel in which the antireflection coating as the optical system of this embodiment is used. In FIG. 20, a touch panel 701 is placed on a surface of an electronic display and is adapted to detect a position where a finger or an input pen contacts and perform an input operation based on the detection signal. Known types of the touch panel 701 are optical type, ultrasonic type, electromagnetic type, resistance film type, and capacitance type, among which the resistance film type is commonly used in combination with the liquid crystal display. Therefore, this embodiment illustrates the touch panel 701 of the resistance film type.

The touch panel 701 of this embodiment comprises a transparent substrate 702 made of a flat and transparent material such as glass and provided with a transparent conductive film 704 on one surface and a transparent resin substrate 703 made of polyester resin and provided with a transparent conductive film 705 on one surface and is structured such that the transparent conductive films 704, 705 are opposed to each other with a predetermined gap by a spacer 706.

In the resistance-film touch panel 701, when a user pushes the transparent resin substrate 703, the opposed transparent conductive films 704, 705 are brought into contact with each other. Based on potential of the contact position, a control means (not shown) judges the contact position on the panel.

The touch panel 701 further comprises an antireflection coating 710 comprised of an alumina ($Al_2O_3$) layer 707, a zirconia ($ZrO_2$) layer 708, and a magnesium fluoride ($MgF_2$) layer 709 disposed on an outer surface of the transparent resin substrate 703 in this order. The antireflection coating 710 is formed so as to have thickness that permits reduction in the reflectance in a wide wavelength range due to interference effect, using the plasma ion plating of applying the positive pulse bias described in the first embodiment.

In accordance with this embodiment, the $MgF_2$ layer 709 that is highly wear resistant and has high transmittance can be formed on an outermost surface. Consequently, the touch panel 701 with low reflectance in a wide wavelength range and high wear resistance on the surface can be achieved.

By combining the touch panel 701 with the electronic display, a display that provides high contrast ratio and satisfactory visibility with less mirroring under bright environment is attained.

Embodiment 9

A ninth embodiment illustrates that the optical system of the present invention is applied to a polarizer used in a touch panel.

Figure 21:
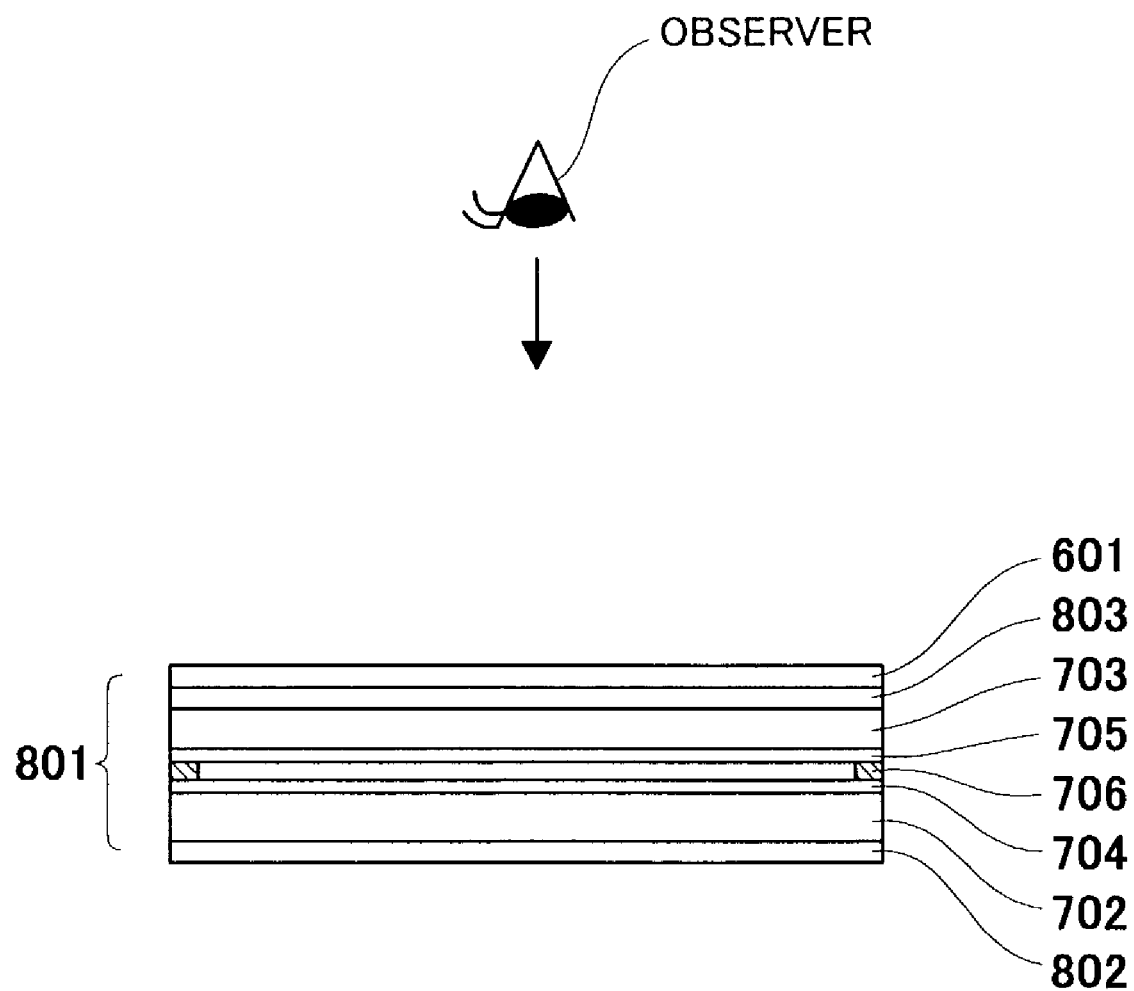
FIG. 21 is a cross-sectional view showing a structure of a touch panel in which a polarizer as an optical system according to a ninth embodiment of the present invention is used.

FIG. 21 is a cross-sectional view showing a structure of the touch panel in which a polarizer as the optical system of this embodiment is used. In FIG. 21, the same reference numerals as those in FIG. 20 denote the same or corresponding parts.

As shown in FIG. 21, a touch panel 801 comprises transparent substrates 702, 703 and transparent conductive films 704, 705 which are configured in the same manner as the touch panel 701 in FIG. 20. The transparent conductive films 704, 705 are formed by evaporation or sputtering and made of metal oxide such as indium tin oxide, or metal such as gold, palladium, aluminum, or silver. The thin films made of the metal oxide or metal generally have high refractive indices, and hence, interference reflection between a gap formed by a spacer 706 and the transparent conductive film 704, and between the gap and the transparent conductive film 705 is greater than surface reflection of the touch panel 801.

Instead of the structure of the antireflection coating 710 of the touch panel 701 in FIG. 20, the touch panel 801 of this embodiment is structured such that a ¼ wavelength plate 803 and a polarizer 601 are formed on an outer surface of the transparent resin substrate 703, and a ¼ wavelength plate 802 is formed as necessary on an outer surface of the transparent substrate 702. The polarizer 601 is identical to the polarizer (see FIG. 19) of the seventh embodiment and has an antireflection coating on the outermost layer which is deposited by the plasma ion plating of applying the positive pulse described in the first embodiment. The polarizer 601 and the ¼ wavelength plate 803 constitute so-called circular polarization plate and function as follows.

The light is incident on the polarizer 601 from outside, and a specified linearly-polarized light component is absorbed in the polarizer 601 and another specified linearly-polarized component whose polarizing axis is orthogonal to that of the former specified linearly-polarized component is transmitted through the polarizer 601. The linearly-polarized light which has been transmitted through the polarizer 601 travels through the ¼ wavelength plate 803, thereby resulting in substantially circularly-polarized light. Part of this light is reflected on an interface between the transparent resin substrate 703 and the transparent conductive film 705, and an interface between the transparent conductive film 705 and air, and in this reflection, the circularly-polarized light rotates toward an opposite direction due to $\pi$ phase deviation. This reflected light re-travels through the ¼ wavelength plate 803 and is thereby converted into the linearly-polarized light and absorbed in the polarizer 601, and therefore does not leak to the outside. In brief, the light reflected on the respective interfaces of the touch panel 801 is absorbed in the polarizer 601 and the ¼ wavelength plate 803 constituting the circular polarization plate, and therefore, does not leak to the outside.

Besides, since the reflection on the outermost surface of the touch panel 801 is reduced by the multilayered film comprised of the magnesium fluoride film, and the like, the reflection of the incident light from outside is greatly reduced. Further, since the outermost surface is made of magnesium fluoride that is highly wear resistant, the touch panel with high wear resistance is achieved. (see FIG. 19).

When the electronic display disposed under the touch panel 801 is a liquid crystal display, display light is generally linearly-polarized light. Therefore, in the case of the liquid crystal display, the ¼ wavelength plate 802 is also placed on the innermost surface of the touch panel 801 to allow the display light to be converted into linearly-polarized light that can pass through the polarizer 601 by cooperation of the ¼ wavelength plate 803 disposed on the front-surface side of the touch panel 801 and the ¼ wavelength plate 802 disposed on the rear-surface side of the touch panel 801. This makes it difficult that the display light of the liquid crystal display is absorbed in the polarizer 601. Consequently, display becomes bright.

As should be appreciated from the foregoing, in accordance with the touch panel 801 of this embodiment, the function of the circular polarization plate allows the reflection at the respective interfaces of the touch panel 801 to be suppressed. Accordingly, by combining the touch panel 801 with the electronic display, a display that provides high contrast ratio and satisfactory visibility with less mirroring under bright environment is achieved.

The present invention is carried out in the above-mentioned embodiments, and has the following effects. First, its is possible to provide the optical system that is superior in optical characteristic and wear resistance, and is capable of being formed at low temperatures.

Second, it is possible to provide the optical waveguide that is easily manufactured and has freedom in selecting the substrate material and the filling material.

Third, it is possible to provide the touch panel that is superior in optical characteristic and wear resistance and does not damage the substrate.

Fourth, it is possible to provide the optical system that absorbs less water, is less affected by change in environmental conditions such as temperature and humidity, and has stable optical characteristic.

As this embodiment may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An optical system at least partially comprising fluoride having a crystal grain diameter of 3 nm to 10 nm, wherein the fluoride is deposited on a substrate, the fluoride having a specific surface area of 1 $m^2/g$ to 5 $m^2/g$.

2. The optical system according to claim 1, further comprising a coating including the fluoride, and a substrate, the coating being disposed on the substrate.

3. The optical system according to claim 2, wherein the fluoride is magnesium fluoride.

4. The optical system according to claim 2, wherein the substrate is formed of a silica.

5. The optical system according to claim 2, wherein the substrate is formed of a resin.

6. The optical system according to claim 2, wherein the coating is an antireflection coating.

7. The optical system according to claim 2, wherein the coating forms a dielectric multilayered film reflector.

8. The optical system according to claim 7, wherein the dielectric multilayered film reflector further comprises at least one layer formed of alumina and at least one layer formed of SiN.

9. The optical system according to claim 2, wherein the substrate is an optical fiber and where the coating is disposed at an end of the optical fiber.

10. The optical system according to claim 9, wherein the optical fiber is formed of a plastic.

11. The optical system according to claim 9, wherein the optical fiber is formed of a resin.

12. The optical system according to claim 2, wherein the substrate is an objective.

13. The optical system according to claim 12, wherein the objective further comprises a hologram and the objective is a focusing lens.

14. The optical system according to claim 2, wherein the substrate is formed of a periodic array of diffusing surfaces, where the period of the diffusing surfaces is less than an optical wavelength.

15. The optical system according to claim 14, wherein the coating is formed over each diffusing surface.

16. An optical waveguide comprising:
a core; and
a coating disposed on at least a portion of the core, the coating comprising fluoride having a crystal grain diameter of 3 nm to 10 nm and having a specific surface area of 1 $m^2/g$ to 5 $m^2/g$,
wherein the coating is deposited on the core.

17. The optical waveguide according to claim 16, wherein the fluoride is magnesium fluoride.

18. The optical waveguide according to claim 16, further comprising a substrate, wherein the coating is disposed between the substrate and the core.

19. The optical waveguide according to claim 16, wherein the core has a higher index of refraction than the coating.

20. A polarizer comprising:
a polarizing film; and
a coating disposed on the polarizing film, the coating comprising a fluoride having a crystal grain diameter of 3 nm to 10 nm and having a specific surface area of 1 $m^2/g$ to 5 $m^2/g$,
wherein the coating is deposited on the polarizing film.

21. The polarizer according to claim 20, wherein the fluoride is magnesium fluoride.

22. The polarizer according to claim 20, further comprising a protective layer disposed between the polarizing film and the coating.

23. The polarizer according to claim 20, wherein the coating comprises an alumina layer, a zirconia layer, and a magnesium fluoride layer.

24. The polarizer according to claim 20, further comprising a protective film, the polarizing film being disposed on the protective film.

25. A touch panel comprising a coating including fluoride having a crystal grain diameter of 3 nm to 10 nm and having a specific surface area of 1 $m^2/g$ to 5 $m^2/g$, wherein the coating is deposited on a substrate.

26. The touch panel according to claim 25, wherein the fluoride is a magnesium fluoride.

27. The touch panel according to claim 25, further comprising;
a touch sensitive structure disposed on the coating; and
a transparent substrate disposed on the touch sensitive structure.

28. The touch panel according to claim 27, wherein the touch sensitive structure comprises, a first transparent conductive film, a second transparent conductive film, and a spacer layer between the first transparent conductive film and the second transparent conductive film.

29. The touch panel according to claim 27, further comprising a transparent resin substrate disposed between the coating and the touch sensitive structure.

30. The touch panel according to claim 25, further comprising a first ¼ wavelength plate.

31. The touch panel according to claim 30, wherein the first ¼ wavelength plate is disposed between the coating and the touch sensitive structure.

32. The touch panel according to claim 31, further comprising a second ¼ wavelength plate disposed adjacent the touch sensitive structure and opposite the first ¼ wavelength plate.

33. An optical system at least partially comprising fluoride having a specific surface area of 1 $m^2/g$ to 5 $m^2/g$ and a crystal grain diameter of 3 nm to 10 nm, wherein the fluoride is deposited on a substrate.

34. The optical system according to claim 33, further comprising a layer including the fluoride.

35. The optical system according to claim 34, wherein the fluoride is magnesium fluoride.

36. The optical system according to claim 34, wherein the layer is a surface layer portion.

37. The optical system according to claim 34, wherein the layer forms an antireflection coating.

* * * * *